US012671397B2

(12) United States Patent
Deters et al.

(10) Patent No.: US 12,671,397 B2
(45) Date of Patent: Jun. 30, 2026

(54) SEMICONDUCTOR BURN-IN MACHINE POWER REGULATOR HAVING MULTIPLE POWER MODES

(71) Applicant: Micro Control Company, Fridley, MN (US)

(72) Inventors: Kevin Roland Deters, Andover, MN (US); Philip Alan Bailey, Marine on St. Croix, MN (US)

(73) Assignee: Micro Control Company, Fridley, MN (US)

( * ) Notice: Subject to any disclaimer, the term of this patent is extended or adjusted under 35 U.S.C. 154(b) by 0 days.

(21) Appl. No.: 18/918,748

(22) Filed: Oct. 17, 2024

(65) Prior Publication Data

US 2025/0132754 A1 Apr. 24, 2025

Related U.S. Application Data

(60) Provisional application No. 63/592,486, filed on Oct. 23, 2023.

(51) Int. Cl.
G01R 31/30 (2006.01)
G01R 31/28 (2006.01)
(Continued)

(52) U.S. Cl.
CPC ......... H03K 3/017 (2013.01); G01R 31/2863 (2013.01); G01R 31/3004 (2013.01);
(Continued)

(58) Field of Classification Search
CPC ........... G01R 31/2851; G01R 31/2855; G01R 31/2856; G01R 31/2863; G01R 31/2868;
(Continued)

(56) References Cited

U.S. PATENT DOCUMENTS 2,484,585 A 10/1949 Quinn
3,529,230 A 9/1970 Tedd
(Continued)

FOREIGN PATENT DOCUMENTS

CN 103713207 4/2014
JP 05-267874 10/1993
(Continued)

OTHER PUBLICATIONS

International Search Report and Written Opinion of PCT/US2015/014562, dated Apr. 23, 2015.
(Continued)

*Primary Examiner* — Levi Gannon
(74) *Attorney, Agent, or Firm* — Brian D. Kaul; Westman, Champlin & Koehler, P.A.

(57) ABSTRACT

A semiconductor burn-in board configured for insertion into a chamber of a semiconductor burn-in machine includes a power regulator board and a testing board. The power regulator board includes a main power connector configured to receive main power from a semiconductor burn-in machine, a plurality of power supplies each configured to receive the main power from the main power connector and convert the main power to test power, and a pair of test power connectors for each power supply. The testing board is attached to the power regulator board and includes a plurality of device testing units. Each device testing unit is configured to receive the test power from at least one of the power supplies through at least one pair of the test power connectors and apply test signals to a semiconductor device received in the device testing unit.

19 Claims, 15 Drawing Sheets

(51) Int. Cl.

| | | |
|---|---|---|
| *G05F 1/46* | (2006.01) | |
| *G05F 1/66* | (2006.01) | |
| *H02J 1/10* | (2026.01) | |
| *H03K 3/017* | (2006.01) | |

(52) U.S. Cl.
CPC .................. *G05F 1/46* (2013.01); *G05F 1/66* (2013.01); *H02J 1/10* (2013.01)

(58) Field of Classification Search
CPC ............ G01R 31/2872; G01R 31/2874; G01R 31/2875; G01R 31/2877; G01R 31/2879; G01R 31/30; G01R 31/3004; G01R 31/31924; G05F 1/10; G05F 1/46; G05F 1/56; G05F 1/575; G05F 1/59; G05F 1/66; G06F 1/26; G06F 1/263; H02J 1/10; H02J 1/102; H02J 1/12; H02M 3/156; H02M 3/157; H02M 3/158; H02M 3/1584; H03K 3/017
See application file for complete search history.

(56) References Cited

U.S. PATENT DOCUMENTS

| | | | |
|---|---|---|---|
| 3,979,671 | A | 9/1976 | Meeker et al. |
| 4,035,715 | A | 7/1977 | Wyman et al. |
| 4,145,620 | A | 3/1979 | Dice |
| 4,378,139 | A | 3/1983 | Griffin et al. |
| 4,381,032 | A | 4/1983 | Cutchaw |
| 4,626,643 | A | 12/1986 | Minet |
| 4,682,268 | A | 7/1987 | Okano et al. |
| 4,683,424 | A | 7/1987 | Cutright et al. |
| 4,791,364 | A | 12/1988 | Kufis et al. |
| 4,851,965 | A | 7/1989 | Gabuzda et al. |
| 4,897,762 | A | 1/1990 | Daikoku et al. |
| 4,900,948 | A | 2/1990 | Hamilton |
| 4,912,600 | A | 3/1990 | Jaeger et al. |
| 4,924,170 | A | 5/1990 | Henze |
| 4,935,864 | A | 6/1990 | Schmidt et al. |
| 4,969,511 | A | 11/1990 | Person |
| 4,982,153 | A | 1/1991 | Collins et al. |
| 4,993,955 | A | 2/1991 | Savant |
| 5,001,423 | A | 3/1991 | Abrami et al. |
| 5,006,796 | A | 4/1991 | Burton et al. |
| 5,086,269 | A | 2/1992 | Nobi |
| 5,093,982 | A | 3/1992 | Gussman |
| 5,103,168 | A | 4/1992 | Fuoco |
| 5,151,574 | A | 9/1992 | Urban |
| 5,164,661 | A | 11/1992 | Jones |
| H1145 | H | 3/1993 | Anderson |
| 5,195,827 | A | 3/1993 | Audy et al. |
| 5,198,752 | A | 3/1993 | Miyata et al. |
| 5,198,753 | A | 3/1993 | Hamburgen |
| 5,249,972 | A | 10/1993 | Walker |
| 5,270,572 | A | 12/1993 | Nakajima et al. |
| 5,277,594 | A | 1/1994 | Matsuoka et al. |
| 5,320,550 | A | 6/1994 | Uratsuji et al. |
| 5,359,285 | A | 10/1994 | Hashinaga et al. |
| 5,361,188 | A | 11/1994 | Kondou et al. |
| 5,365,400 | A | 11/1994 | Ashiwake et al. |
| 5,414,370 | A | 5/1995 | Hashinaga et al. |
| 5,428,503 | A | 6/1995 | Matsushima et al. |
| 5,449,234 | A | 9/1995 | Gipp et al. |
| 5,493,237 | A | 2/1996 | Volz et al. |
| 5,515,910 | A | 5/1996 | Hamilton et al. |
| 5,544,012 | A | 8/1996 | Koike |
| 5,579,826 | A | 12/1996 | Hamilton et al. |
| 5,582,235 | A | 12/1996 | Hamilton et al. |
| 5,697,795 | A | 12/1997 | Abe |
| 5,722,772 | A | 3/1998 | Keil et al. |
| 5,748,007 | A | 5/1998 | Gaschke |
| 5,807,104 | A | 9/1998 | Ikeya et al. |
| 5,889,651 | A | 3/1999 | Sasaki et al. |
| 5,911,897 | A | 6/1999 | Hamilton |
| 5,918,665 | A | 7/1999 | Babcock et al. |

| | | | | |
|---|---|---|---|---|
| 5,923,179 | A | 7/1999 | Taylor | |
| 5,952,842 | A | 9/1999 | Fujimoto | |
| 5,977,785 | A | 11/1999 | Burward-Hoy | |
| 5,978,218 | A | 11/1999 | Fujimoto et al. | |
| 6,043,980 | A | 3/2000 | Katsui | |
| 6,086,387 | A | 7/2000 | Gallagher et al. | |
| 6,100,706 | A | 8/2000 | Hamilton et al. | |
| 6,144,215 | A | 11/2000 | Maxwell et al. | |
| 6,166,555 | A | 12/2000 | Lillja et al. | |
| 6,169,442 | B1 | 1/2001 | Meehan et al. | |
| 6,175,498 | B1 | 1/2001 | Conroy et al. | |
| 6,184,504 | B1 | 2/2001 | Cardella | |
| 6,213,806 | B1 | 4/2001 | Choy | |
| 6,259,264 | B1 | 7/2001 | Freund et al. | |
| 6,288,371 | B1 | 9/2001 | Hamilton et al. | |
| 6,323,665 | B1 | 11/2001 | Johnson et al. | |
| 6,332,710 | B1 | 12/2001 | Aslan et al. | |
| 6,414,470 | B1 | 7/2002 | Liu et al. | |
| 6,435,547 | B2 | 8/2002 | Igawa | |
| 6,496,118 | B1 | 12/2002 | Smith | |
| 6,514,097 | B1 | 2/2003 | Conroy | |
| 6,554,469 | B1 | 4/2003 | Thomson et al. | |
| 6,570,398 | B2 | 5/2003 | Murphy et al. | |
| 6,636,062 | B2 | 10/2003 | Gaasch et al. | |
| 6,693,806 | B2 | 2/2004 | Uchida | |
| 6,698,718 | B2 | 3/2004 | Yoo | |
| 6,727,745 | B2 | 4/2004 | Shearon et al. | |
| 6,741,089 | B2 | 5/2004 | Conroy | |
| 6,756,807 | B2 | 6/2004 | Johnson et al. | |
| 6,956,391 | B2 | 10/2005 | Kamitani | |
| 7,053,648 | B2 | 5/2006 | DeVey | |
| 7,114,556 | B2 | 10/2006 | Hamilton et al. | |
| 7,141,955 | B1 | 11/2006 | Martinez | |
| 7,150,561 | B1 | 12/2006 | D'Aquino et al. | |
| 7,190,184 | B2 | 3/2007 | Haji-Sheikh et al. | |
| 7,252,432 | B1 | 8/2007 | Henderson et al. | |
| 7,271,605 | B2 | 9/2007 | Naitou et al. | |
| 7,288,951 | B1 | 10/2007 | Bailey et al. | |
| 7,296,430 | B2 | 11/2007 | Hamilton et al. | |
| 7,355,428 | B2 | 4/2008 | Kabbani et al. | |
| 7,378,836 | B2 | 5/2008 | Teoh et al. | |
| 7,397,262 | B2 | 7/2008 | Bailey et al. | |
| 7,461,974 | B1 | 12/2008 | Aslan et al. | |
| 7,650,762 | B2 | 1/2010 | Hamilton et al. | |
| 7,826,998 | B1 | 11/2010 | Taheri et al. | |
| 7,868,633 | B1 | 1/2011 | Chen | |
| 7,959,175 | B2 | 6/2011 | Kato et al. | |
| 8,040,145 | B2 | 10/2011 | Kabbani | |
| 9,366,721 | B2 | 6/2016 | Teoh | |
| 10,126,177 | B2 | 11/2018 | Olson et al. | |
| 10,342,883 | B2 | 7/2019 | Zambaux | |
| 11,680,980 | B2 | 6/2023 | Tremmel et al. | |
| 12,007,434 | B2 | 6/2024 | Fawcett | |
| 2002/0149911 | A1 | 10/2002 | Bishop et al. | |
| 2003/0112025 | A1 | 6/2003 | Hamilton et al. | |
| 2005/0036352 | A1 | 2/2005 | Norris et al. | |
| 2006/0049843 | A1 | 3/2006 | Jenkins et al. | |
| 2006/0063285 | A1 | 3/2006 | Miller | |
| 2006/0265174 | A1 | 11/2006 | Doyle et al. | |
| 2007/0257647 | A1* | 11/2007 | Chen ..................... | H02M 3/157 323/282 |
| 2011/0025284 | A1* | 2/2011 | Xu ....................... | H02M 3/1584 327/294 |
| 2019/0285695 | A1 | 9/2019 | Kim et al. | |

FOREIGN PATENT DOCUMENTS

| | | |
|---|---|---|
| JP | 6-101-947 A | 4/1994 |
| KR | 1020090088733 | 8/2009 |
| KR | 1020150122881 | 11/2015 |
| KR | 1020160073842 | 6/2016 |
| KR | 1020190107796 | 9/2019 |
| KR | 20210106710 A | 8/2021 |
| TW | 201413264 | 4/2014 |
| TW | 201428247 | 7/2014 |
| TW | 201501099 | 1/2015 |
| TW | 201539003 | 10/2015 |

(56) References Cited

FOREIGN PATENT DOCUMENTS

| TW | 201542993 | 11/2015 |
| WO | 9947792 | 9/1999 |
| WO | 2015123078 A1 | 8/2015 |

OTHER PUBLICATIONS

English translation of Office Action including a Search Report for Taiwan Patent Application No. 104104589, dated Jun. 27, 2018.

ADT7461 ±1°C Temperature Monitor with Series Resistance Cancellation, May 2012—Rev. 7 @ Semiconductor Components Industries, LLC, http://onsemi.com, 20 pages.

Hughes, Ronnie D., "Remote Diodes yield accurate temperature measurements," Jul. 10, 2003, www.edn.com, pp. 59-62.

±1°C Temperature Sensor with Series-R, η-Factor, and Automatic Beta Compensation, Texas Instruments Incorporated, Copyright @ 2009-2013, 42 pages.

U.S. Appl. No. 18/893,081 for "Semiconductor Burn-In Board", filed Sep. 23, 2024.

Product information for Liquid Cooled Semiconductor Heatsink, retrieved from https://www.imohave.co/products/liquid-cooled-semiconductor-heatsink?srsltid=AfmBOoqgfOwKRf4QOewA_NLGXgJXfL0xtul9HM32frQRGVGLX5Le-6bX on Oct. 8, 2024.

"Thermal Control Hardware for Accelerated Run-In Testing of Multi-Chip Modules", IBM Tech. Disclosure Bulletin, vol. 32, No. 5A, pp. 129-130, Oct. 1989.

Office Communication for U.S. Appl. No. 10/669,736, filed Sep. 24, 2003, date of mailing Oct. 14, 2005.

"Burn-in Fixture for Modules", IBM Technical Disclosure Bulletin, vol. 27, No. 7B, Dec. 1984, p. 4278.

"Thermal Aspects of Burn-In for High Power Semiconductor Devices," Micro Control Company, Reprinted 2002, IEEE Proceedings from The Eight Intersociety Conf. on Thermal and Thermomechanical Phenomena in Electronic Systems, California.

Notice of Preliminary Rejection dated Feb. 23, 2024 from Korean Patent Application No. 10-2021-0123121, filed Sep. 15, 2021.

Translation of the Official Letter and Search Report dated Oct. 22, 2024 from Taiwanese Application No. 110134473, filed Sep. 15, 2021.

U.S. Appl. No. 18/826,842 for Semiconductor Burn-In Machine Cooling System, filed Sep. 6, 2024.

* cited by examiner

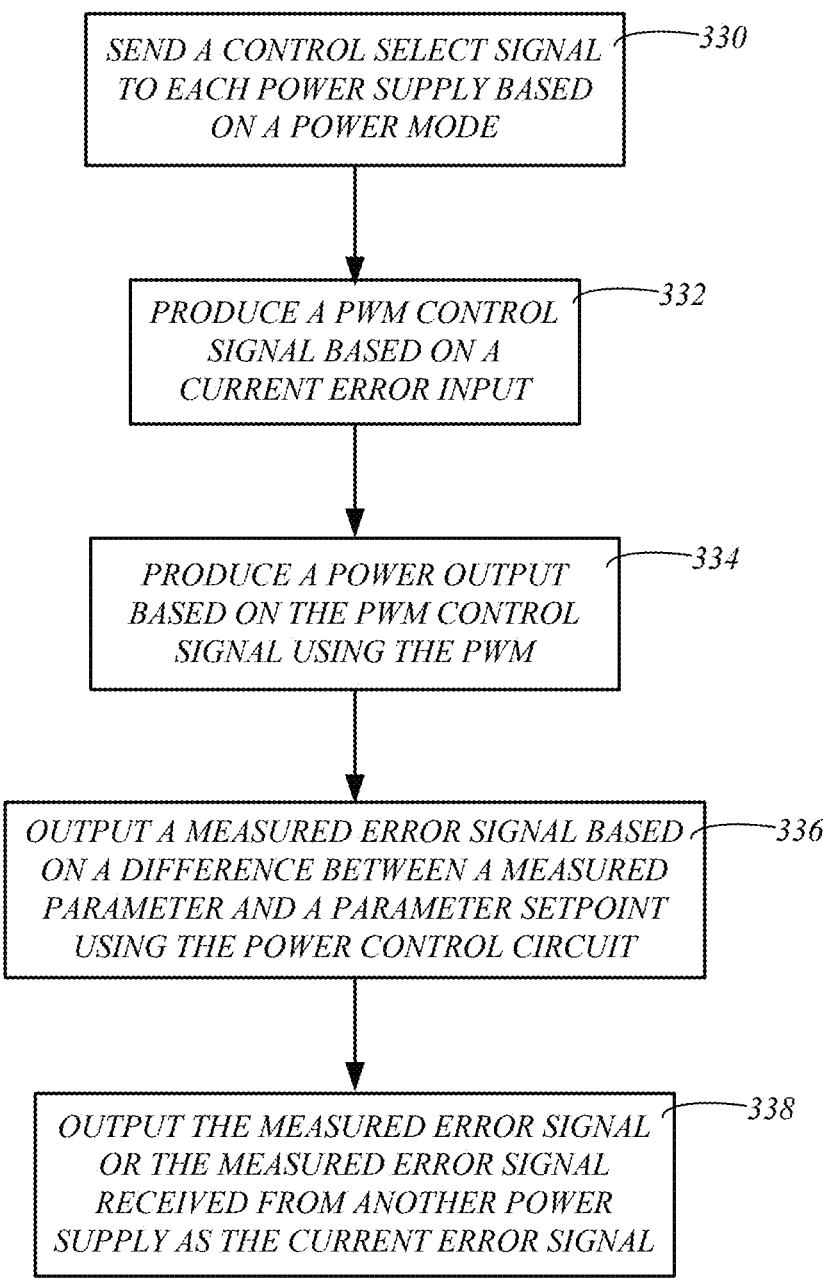

SEND A CONTROL SELECT SIGNAL TO EACH POWER SUPPLY BASED ON A POWER MODE —330

PRODUCE A PWM CONTROL SIGNAL BASED ON A CURRENT ERROR INPUT —332

PRODUCE A POWER OUTPUT BASED ON THE PWM CONTROL SIGNAL USING THE PWM —334

OUTPUT A MEASURED ERROR SIGNAL BASED ON A DIFFERENCE BETWEEN A MEASURED PARAMETER AND A PARAMETER SETPOINT USING THE POWER CONTROL CIRCUIT —336

OUTPUT THE MEASURED ERROR SIGNAL OR THE MEASURED ERROR SIGNAL RECEIVED FROM ANOTHER POWER SUPPLY AS THE CURRENT ERROR SIGNAL —338

*FIG. 15*

SEMICONDUCTOR BURN-IN MACHINE POWER REGULATOR HAVING MULTIPLE POWER MODES

CROSS-REFERENCE TO RELATED APPLICATION

The present application is based on and claims the benefit of U.S. provisional patent application Ser. No. 63/592,486, filed Oct. 23, 2023, the content of which is hereby incorporated by reference in its entirety.

FIELD OF THE INVENTION

Embodiments of the present disclosure generally relate to semiconductor "burn-in" machines that stress test semiconductor devices (e.g., integrated circuit chips). More particularly, embodiments of the present disclosure relate to a power regulator of a semiconductor burn-in machine having multiple modes of supplying power to a testing stage of a burn-in board where the stress testing of the semiconductor devices is conducted.

BACKGROUND

Semiconductor devices, such as silicon integrated circuit chips or other semiconductor devices, are subject to early failure during their life cycle. It is desirable to detect and eliminate the devices that are most prone to early failure prior to sending them to market. Additionally, it is desirable to identify the components of the semiconductor devices that cause the early failures so that they may be improved. Thus, producers of these devices have found it cost-effective to utilize burn-in systems to rigorously temperature stress the semiconductor devices while simultaneously powering them in order to test the reliability of the devices.

Semiconductor burn-in machines have a testing chamber that houses a plurality of burn-in boards, each of which supports a number of device testing units that receive semiconductor devices to be tested. The burn-in boards include a testing stage comprising device testing units that power the semiconductor devices and expose the devices to operational stress (e.g., heat stress, power stress, etc.) over an extended period of time.

The stress testing of high performance semiconductor devices typically requires the application of high test power to the devices. Semiconductor burn-in machines generally convert incoming power (e.g., 480 VAC) to bulk power (e.g., 4000 W) having a voltage of about 44 VDC, to the test power having a voltage (e.g., 0.5-3.0 or 0.5-4.0 VDC) that is usable by the testing stage of the burn-in board to power the device testing units. The power regulator generally includes a pre-regulator that converts the bulk power to main power having a reduced voltage (e.g., 7-12 VDC) and a post regulator that converts the main power to the test power.

The post regulator generally comprises multiple power supplies that supply the test power to the testing stage of the burn-in board. The outputs of groups of the power supplies may be joined together in parallel to meet particular power demands of the testing stage, such as described in U.S. Pat. Nos. 7,288,951 and 7,650,762, which issued to Micro Control Company and are incorporated herein by reference in their entirety.

It is important to control the voltage across the semiconductor devices being tested (e.g., test load) during stress testing to ensure that the specifications of the test being conducted are met. For example, if the voltage across the test load is not in accordance with the specifications of the test, the testing results will be unreliable. The task of maintaining the voltage across the test load at a desired level is made difficult by the fact that the test load will vary due to temperature changes in the semiconductor devices and other factors over the course of a testing operation.

The production of the test power can place a heavy demand on each of the power supplies of the post regulator. For example, as the test load increases, the current supplied to the testing stage by the power supplies must increase in order to maintain the desired target voltage across the test load. Occasionally, the demand for current exceeds the capability of the power supplies.

Each of the power supplies may include a voltage control circuit that operates to ensure that the desired target voltage across the test load is achieved during testing operations, and a current control circuit to ensure that the power supply does not exceed current limits. During operation, the power supply normally operates in a voltage control mode, during which the voltage control circuit controls the power supply to maintain the target voltage across the test load. However, if the current output from the power supply reaches a current limit, the current control circuit forces the power supply to enter a current control mode, in which a reduced target voltage is maintained across the test load to prevent the current output from exceeding the current limit of the power supply.

As mentioned above, the post regulator may be operable in different power modes, each utilizing a different combination of the test power outputs from the power supplies to meet the test power demands of the testing stage. For example, a single power mode may output test power using one of the power supplies, a dual power mode may output test power that combines the power output of two of the power supplies, a triple power mode may output test power that combines the power output of three power supplies, etc.

Such power modes complicate the circuitry of the post regulator, because a power supply must utilize a unique voltage control circuit for each power mode in which it is involved. For example, the voltage control circuit of a power supply operating in the single power mode is different from the voltage control circuit that must be used by the power supply when operating in the dual power mode. As a result, conventional semiconductor machine power supplies are configured with multiple voltage control circuits and the power supply switches between the circuits depending on the power mode it is operated in.

Due to the limited circuit space that is available to the power supplies, they are typically limited to only a few power modes, such as single, dual, triple and quad power modes, for example, even though the post regulator may comprise twelve or more power supplies. The complexity and cost of adding more voltage control circuits for additional power modes also contributes to the limited number of available power modes.

SUMMARY

Embodiments of the present disclosure relate to a semiconductor burn-in machine having multiple power modes, a power regulator for a testing stage of a semiconductor burn-in board having multiple power modes, and related methods of operation.

One embodiment of the power regulator for a testing stage of a semiconductor burn-in board includes a plurality of power supplies and a controller. Each power supply includes a pulse width modulator controller configured to produce a pulse width modulator control signal based on a current error input, a pulse width modulator configured to produce a power output based on the pulse width modulator control signal, a power control circuit configured to output a measured error signal based on a difference between a measured parameter of the power output and a parameter setpoint, and an error signal selector configured to output as the current error input either the measured error signal or the measured error input from one of the other power supplies based on a control select signal. The controller is configured to issue the control select signals to the power supplies based on a power mode.

In one example of a method of operating a power regulator for a testing stage of a semiconductor burn-in board, the power regulator includes a plurality of power supplies and a power regulator controller. Each power supply includes a pulse width modulator controller, a pulse width modulator, a power control circuit, and an error signal selector. In the method, a control select signal is sent to each of the plurality of power supplies based on a power mode using the power regulator controller. At each power supply: a pulse width modulator control signal is produced based on an error input using the pulse width modulator controller; a power output is produced based on the pulse width modulator control signal using the pulse width modulator; a measured error signal is output based on a difference between a measured parameter of the power output and a parameter setpoint using the power control circuit; and either the measured error signal or the measured error signal received from one of the other power supplies is output as the error input to the pulse width modulator controller based on the control select signal using the error signal selector.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

BRIEF DESCRIPTION OF THE DRAWINGS

FIG. 15 is a flowchart illustrating an example of a method of operating a power regulator for a testing stage of a semiconductor burn-in board, in accordance with embodiments of the present disclosure.

DETAILED DESCRIPTION OF ILLUSTRATIVE EMBODIMENTS

Figure 1:
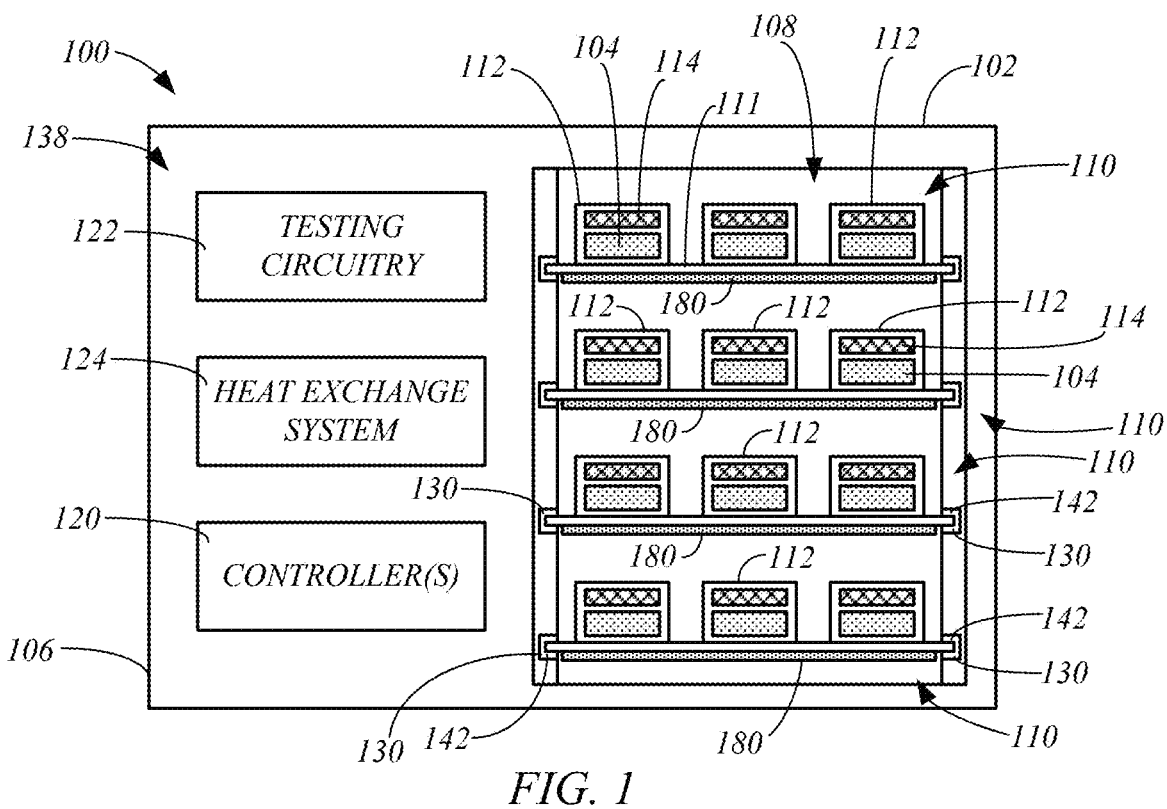
FIG. 1 is a simplified diagram of an example of a semiconductor burn-in system that includes an example of a semiconductor burn-in machine for testing semiconductor devices in accordance with embodiments of the present disclosure.

Embodiments of the present disclosure are described more fully hereinafter with reference to the accompanying drawings. Elements that are identified using the same or similar reference characters refer to the same or similar elements. The various embodiments of the present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art.

Specific details are given in the following description to provide a thorough understanding of the embodiments. However, it is understood by those of ordinary skill in the art that the embodiments may be practiced without these specific details. For example, circuits, systems, networks, processes, frames, supports, connectors, motors, processors, and other components may not be shown, or may be shown in block diagram form in order to not obscure the embodiments in unnecessary detail.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

FIG. 1 is a simplified diagram of an example of a semiconductor burn-in system 100 that includes a semiconductor burn-in machine 102 for testing semiconductor devices 104 in accordance with embodiments of the present disclosure. The burn-in machine 102 includes a housing 106 having a burn-in chamber 108 that is configured to receive one or more burn-in boards or burn-in board assemblies 110 formed in accordance with embodiments of the present disclosure.

Each burn-in board 110 includes a testing board 111 that includes a testing stage having a plurality of device testing units 112. Each testing unit 112 includes a socket that receives one of the devices 104 and is used to perform conventional testing operations on the received device 104 while maintaining the device 104 within a desired temperature range using a thermal head 114. Any suitable device testing unit 112 may be used, such as those produced by Enplas Corporation and Yamaichi Electronics Company, Limited for example.

The system 100 also comprises one or more controllers 120 for controlling functions described herein, testing circuitry 122 and a heat exchange system 124. The testing circuitry 122 generally facilitates the performance of conventional testing operations on the devices 104 using the device testing units 112, while the heat exchange system 124 operates to maintain the devices 104 within a desired temperature range during testing using the thermal heads 114.

Figure 2:
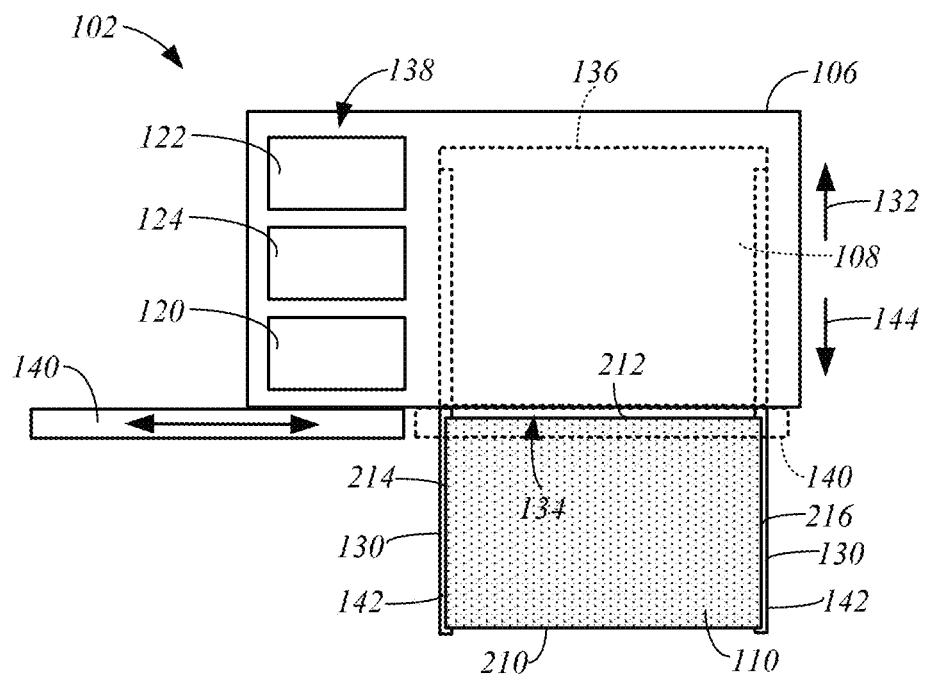
FIG. 2 is a simplified top view of an example of a semiconductor burn-in machine in accordance with embodiments of the present disclosure.
Figure 3:
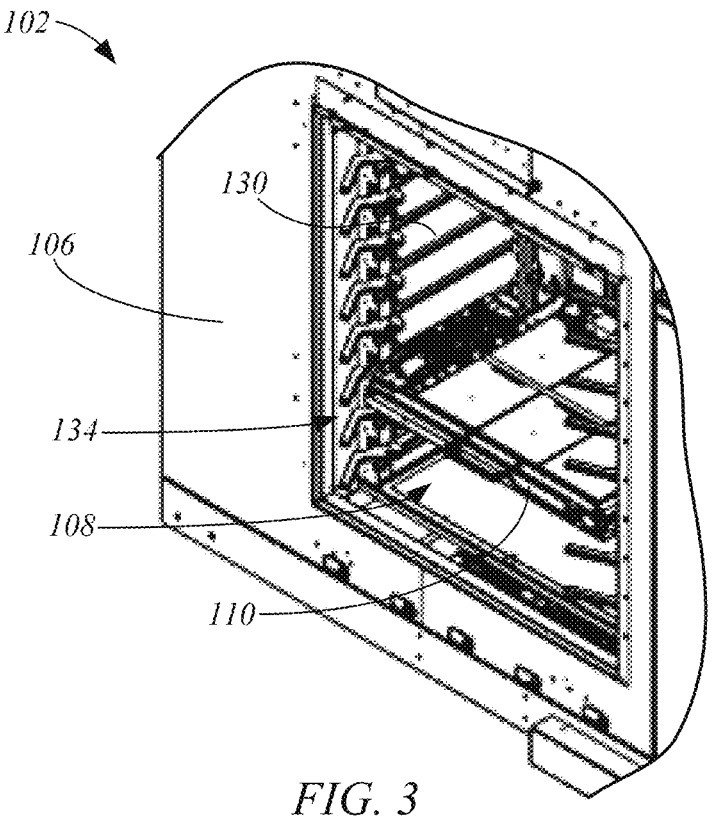
FIG. 3 is an isometric view of a front end of a portion of an example of the semiconductor burn-in machine in accordance with embodiments of the present disclosure.

FIG. 2 is a simplified top view of the burn-in machine 102 shown in FIG. 1 with a burn-in board 110 substantially positioned outside the burn-in chamber 108 in accordance with embodiments of the present disclosure. FIG. 3 is an isometric view of a front end of a portion of an example of the machine 102 in accordance with embodiments of the present disclosure.

The burn-in chamber 108 includes guides 130 that are positioned along sidewalls of the chamber 108. Opposing pairs of the guides 130 are configured to support the burn-in boards 110, as indicated in FIGS. 1 and 3. Installation of a burn-in board 110 in the machine 102 generally involves guided movement of the burn-in board 110 in a rearward direction 132 through an opening 134 in the chamber 108 using the guides 130 until connectors of the burn-in board 110 mate with corresponding connectors of the machine 102. The connectors of the machine are generally supported by a rear wall 136 (e.g., insulated wall, backplane, etc.) of the housing 106 that separates the burn-in chamber 108 from an electronics section 138 that may contain one or more of the controllers 120, components of the testing circuitry 122, and components of the heat exchange system 124, for example, as indicated in FIG. 2. The final stages of the rearward movement of the burn-in board 110 during installation may be controlled using conventional techniques to ensure that the force that is applied between the connectors does not exceed a threshold force at which the connectors could be damaged. Once the burn-in boards 110 are installed in the chamber 108, a door 140 (FIG. 2) may be positioned to cover the opening 134, as indicated in phantom lines.

In one embodiment, the guides 130 comprise pairs of slide rails 142 that are configured to extend through the front opening 134 of the chamber 108, as indicated in FIG. 2. The slide rails 142 may be attached to side walls of the chamber 108 or supported by a frame that is mounted within the chamber 108, for example.

The slide rails 142 simplify the installation of the burn-in boards 110 in the machine 102 by allowing an operator to mount each burn-in board 110 to a pair of the slide rails 142 while they are fully extended through the opening 134 as shown in FIG. 2, rather than having to manually feed the burn-in board 110 to fixed side rails of the chamber 108. The slide rails 142 assist in guiding movement of the burn-in board in the rearward direction 132 while aligning the connectors of the board with the corresponding connectors at the rear wall 136 during installation of the board 110, and in the forward direction 144 during removal or deinstallation of the board 110 from the chamber 108. Additionally, the slide rails 142 enable an operator to inspect or perform maintenance on the burn-in boards 110 while they are supported by the slide rails 142 in their extended position (FIG. 2), rather than having to completely remove the burn-in boards 110 from the machine 102 and move them to another location for inspection or maintenance.

Figure 4:
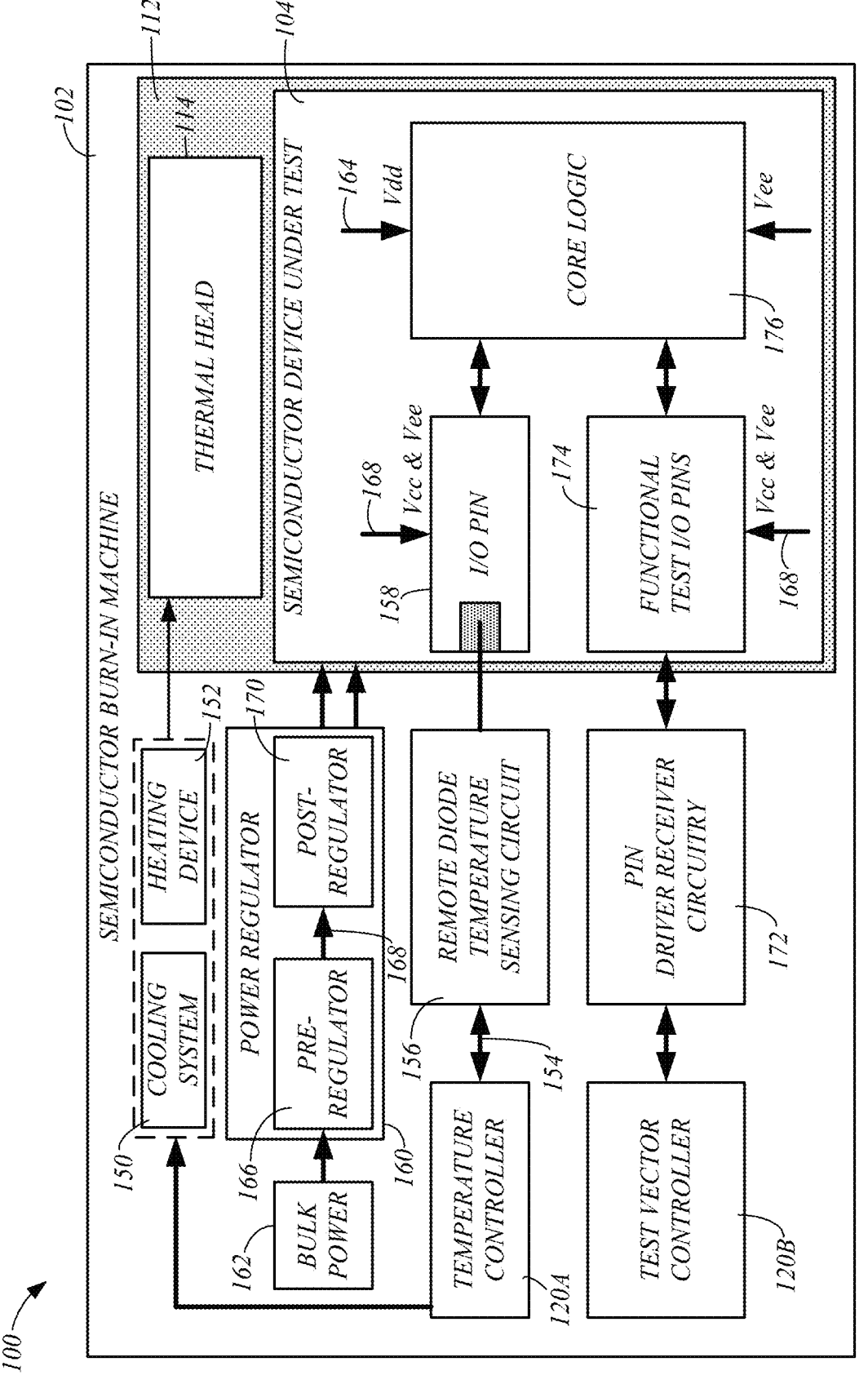
FIG. 4 is a simplified block diagram of an example of a semiconductor burn-in system in accordance with embodiments of the present disclosure.

FIG. 4 is a simplified block diagram of an example of a burn-in system 100 in accordance with embodiments of the present disclosure. Many of the depicted elements are conventional for burn-in systems and, thus, a detailed explanation of each element is unnecessary.

The heat exchange system 124 may include a cooling system 150 that supplies cooling liquid to the thermal head 114 to maintain the devices 104 under test within a desired temperature range and prevent the devices 104 from overheating. In some embodiments, the heat exchange system 124 includes heating devices 152, such as heating elements within the thermal heads 114, that may be used to maintain the temperature of the devices 104 within a desired temperature range. The heat exchange system 124 may include a temperature controller 120A that controls the cooling system 150 and/or the heating devices 152 in response to a temperature output signal 154 from a temperature sensing circuit 156 that senses or obtains a temperature of the device 104, such as through a pin 158 of the device 104, for example.

The machine 102 generally converts incoming power (e.g., 480 VAC) to bulk power 162 (e.g., about 4000-6000 W at 44 VDC). The testing circuitry 122 includes a power regulator 160 that converts the bulk power 162 to test power 164 (e.g., 4000 W) having a voltage that is usable by the testing stage of the testing board 111 to power the device testing units 112. In some embodiments, the power regulator 160 includes a pre-regulator 166 that is configured to convert the bulk power 162 to main power 168 having a voltage of about 12 VDC, and a post-regulator 170 comprising a plurality of power supplies that convert the main power 168 to the test power 164. The main power 168 may be supplied to the testing stage as a positive supply voltage Vcc (e.g., 12 VDC) and a negative supply voltage Vee (e.g., electrical ground), and the testing power 164 may be provided to the testing stage as a logic positive supply voltage Vdd (e.g., about 0.5-3.0, 0.0-1.8 or 0.3-4.0 VDC), for example.

The testing circuitry 122 may include a test vector controller 120B and pin driver receiver circuitry 172, that are used to perform various functional tests on the device 104 through a set of functional test I/O pins 174. The functional tests determine whether components of the semiconductor device 104, such as core logic 176 and/or other components, are operating properly during the testing period.

Figure 5:
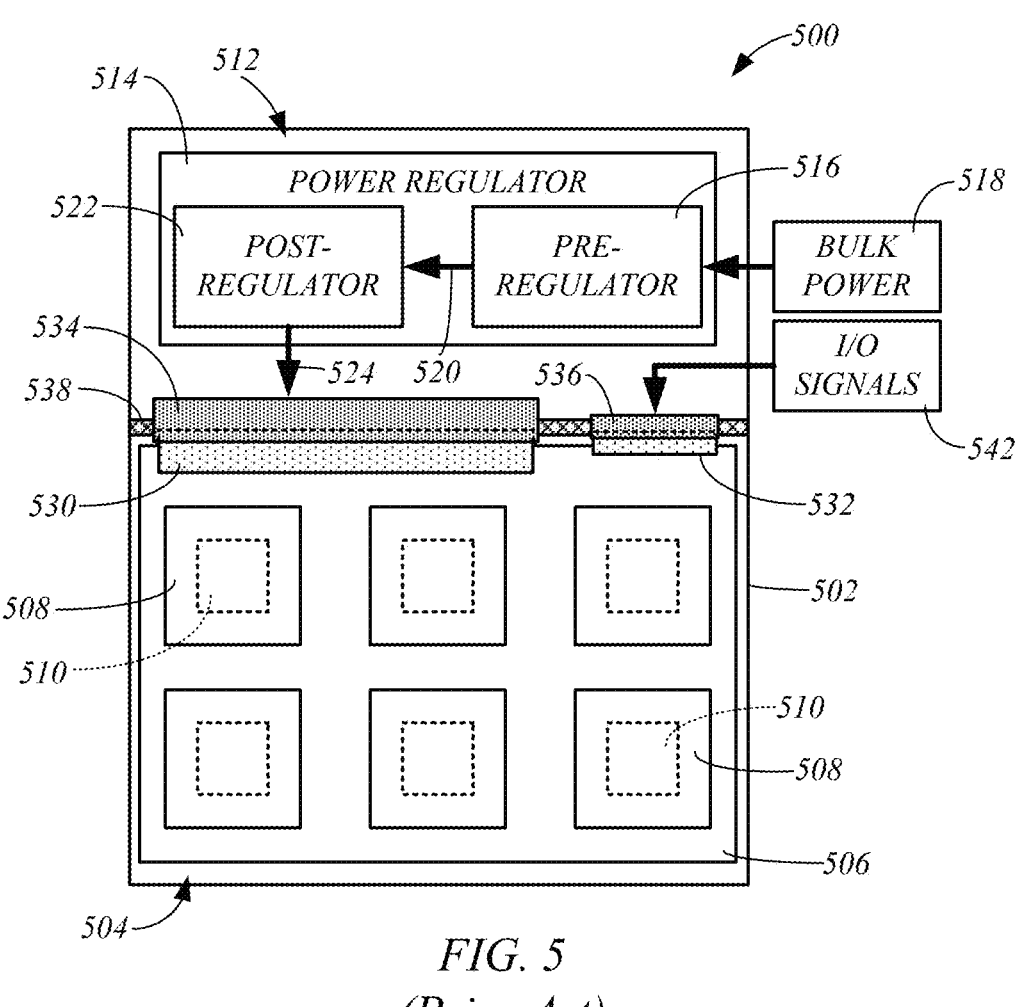
FIG. 5 is a simplified top view of an example of a semiconductor burn-in machine in accordance with the prior art.

FIG. 5 is a simplified top view of a burn-in machine 500 in accordance with the prior art. The machine 500 includes many of the features described above, such as a housing 502 that includes a burn-in chamber 504, in which burn-in boards 506 are received. Each burn-in board 506 includes a plurality of device testing units 508 that perform testing operations on semiconductor devices 510. The housing 502 also includes an electronics section 512 that supports or contains machine electronics, such as a power regulator 514. As discussed above, the power regulator 514 includes a pre-regulator 516 that converts bulk power 518 (e.g., about 4000-5000 W at 44 VDC) into main power 520 (e.g., about 4000 W at 7 VDC, such as about 4400 W at 7 VDC) and a post-regulator 522 that converts the main power 520 to test power 524 that includes logic power having a voltage of approximately 0.0-3.2 VDC.

Each burn-in board 506 includes a power connector 530 and a testing stage connector 532 that are respectively configured to mate with corresponding connectors 534 and 536 of the machine 500 when the burn-in board 506 is fully received within the chamber 504, as generally shown in FIG. 5. The connectors 534 and 536 may be attached to a rear wall (e.g., insulated wall, backplane) 538 of the housing 502 that may separate the electronics section 512 containing the power regulator 514 from the burn-in chamber 504. The test power 524 is delivered to the burn-in board 506 through the mated power connectors 530 and 534 and input/output signals 542 (e.g., test signals, measured results, etc.) are communicated through the mated testing stage connectors 532 and 536.

As mentioned above, the test power 524 delivered by the post-regulator 522 may be around 4000 W and have a voltage ranging from 0.5-3.0 VDC. The test power 524 may be generated by multiple power supplies and delivered through corresponding pins of the connectors 530 and 534. Thus, in one example, the current delivered through each pair of pins (e.g., 16 pairs of pins) of the power connectors 530 and 534 may reach around 125 A. Safe handling of such high power and high current requires very robust power connectors 530 and 534, and associated cabling and infrastructure. The robust power connectors 530 and 534 are generally large and take up valuable space within the machine 500. Additionally, the robust power connectors 530 and 534 can complicate the proper seating of a burn-in board 506 within the chamber 508, such as by requiring a greater force to fully connect the power connectors 530 and 534, for example. Some embodiments of the present disclosure eliminate the need for the robust power connectors 530 and 534 and provide other advantages over prior art semiconductor burn-in machines, such as machine 500.

Figure 6A:
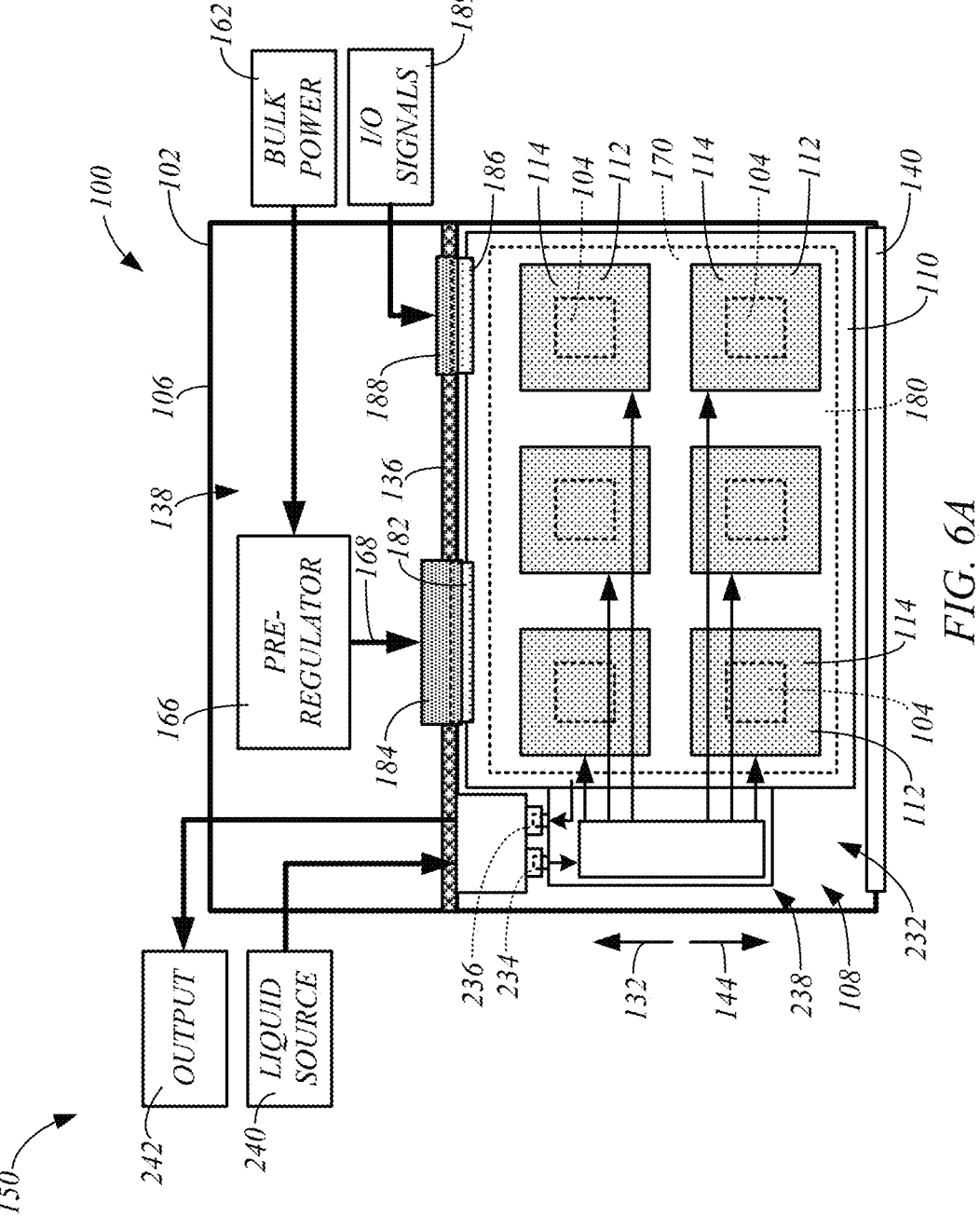
FIGS. 6A and 6B are simplified top views of an example of a semiconductor burn-in system and a semiconductor burn-in machine, respectively illustrating a semiconductor burn-in board in an installed or connected state and a disconnected or deinstalled state in accordance with embodiments of the present disclosure.
Figure 6B:
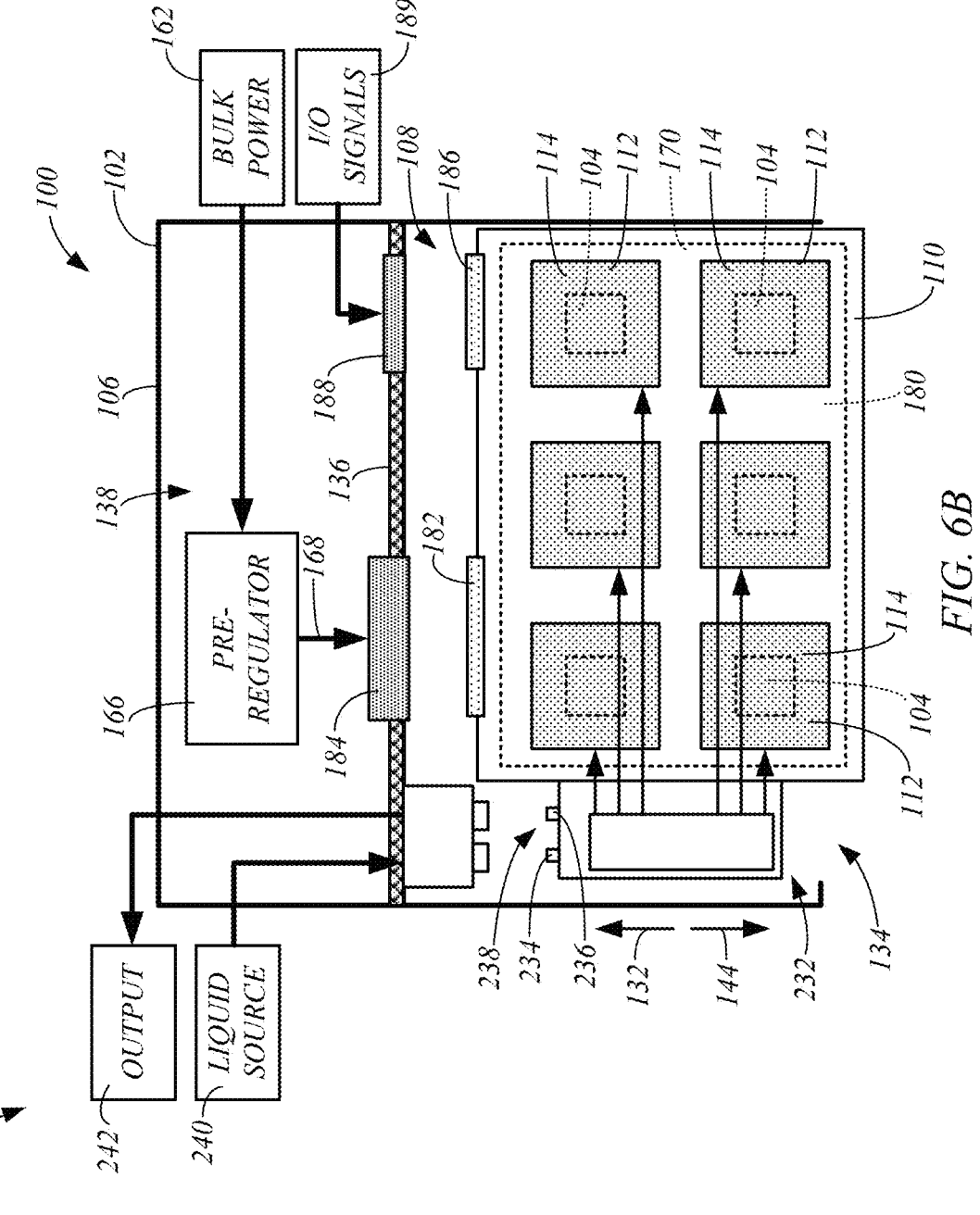

FIGS. 6A and 6B are simplified top views of an example of the system 100 and a semiconductor device burn-in machine 102 in accordance with embodiments of the present disclosure, respectively illustrating a burn-in board 110 in an installed or connected state and a disconnected or deinstalled state. In general, the machine 102 moves the post-regulator 140 from the electronics section 138 of the housing 106 to a power regulator board 180 of the burn-in board 110, as indicated in FIG. 1 and in phantom lines in FIGS. 6A and 6B.

A power connection between the pre-regulator 166 and the post-regulator 170 may be formed by mating a burn-in board main power connector 182 to a machine power connector 184, as indicated in FIG. 6A. The machine power connector 184, which is attached to a mechanical frame of the pre-regulator 166, may be connected to the connector 182 through an opening in a rear wall (e.g., insulated wall, backplane, etc.) 136 that divides the chamber 108 from the electronics section 138. A testing stage connector 186 of the burn-in board is configured to connect to a corresponding machine testing stage connector 188, which may be supported by the wall 136, to facilitate communication of input/output signals 189, such as to the functional test I/O pins 174 (FIG. 4), for example. Accordingly, when the burn-in board 110 in the disconnected or deinstalled state (FIG. 6B) is moved through the opening 134 to the chamber 108 in the rearward direction 132 and fully received in the chamber 108, such as under the assistance of the slide rails 142 (FIGS. 1 and 2), the power connectors 182 and 184 and the testing stage connectors 186 and 188 mate together, as shown in FIG. 6A.

As a result, rather than having to supply the high-current test power 164 from the post-regulator 170 through the power connection between the burn-in board 110 and the machine electronics as in the machine 500 (FIG. 5), the relatively low current (e.g., 86 A) main power 168 (e.g., 6 KW) is delivered from the pre-regulator 166 to the burn-in board 110 through the connectors 182 and 184. The main power 168 may also be delivered through a reduced number of pairs of pins of the connectors 182 and 184, such as 6 pairs, each delivering up to 86 A, rather than the 16 pairs of pins that each deliver up to 125 A, as with the prior art machine 500, for example. As a result, the machine 102 is able to deliver the high power required for performing high power and high-current testing of semiconductor devices 104, while reducing the magnitude of the current passing through the power connectors 182 and 184 of the burn-in board 110 and the machine 102.

Accordingly, the robust power connectors 530 and 534 of the prior art machine 500 may be replaced with a main power connector 182 of the burn-in board 110 and the cooperating power connector 184 of the machine 102 that are smaller and less robust. This reduces costs and can simplify the process of mating the connectors (e.g., lower force). The reduction of the pathways through which the high current power must travel between the machine 102 and the burn-in board 110 results in lower heat production and greater safety for operators.

In some embodiments, the burn-in board 110 comprises an assembly of the power regulator board 180 and the device testing board 111, as indicated in FIG. 1. As mentioned above, the power regulator board 180 comprises the post-regulator 170 and the testing board 111 comprises the device testing units 112 and corresponding circuitry that is typically found in conventional burn-in boards.

Figure 7:
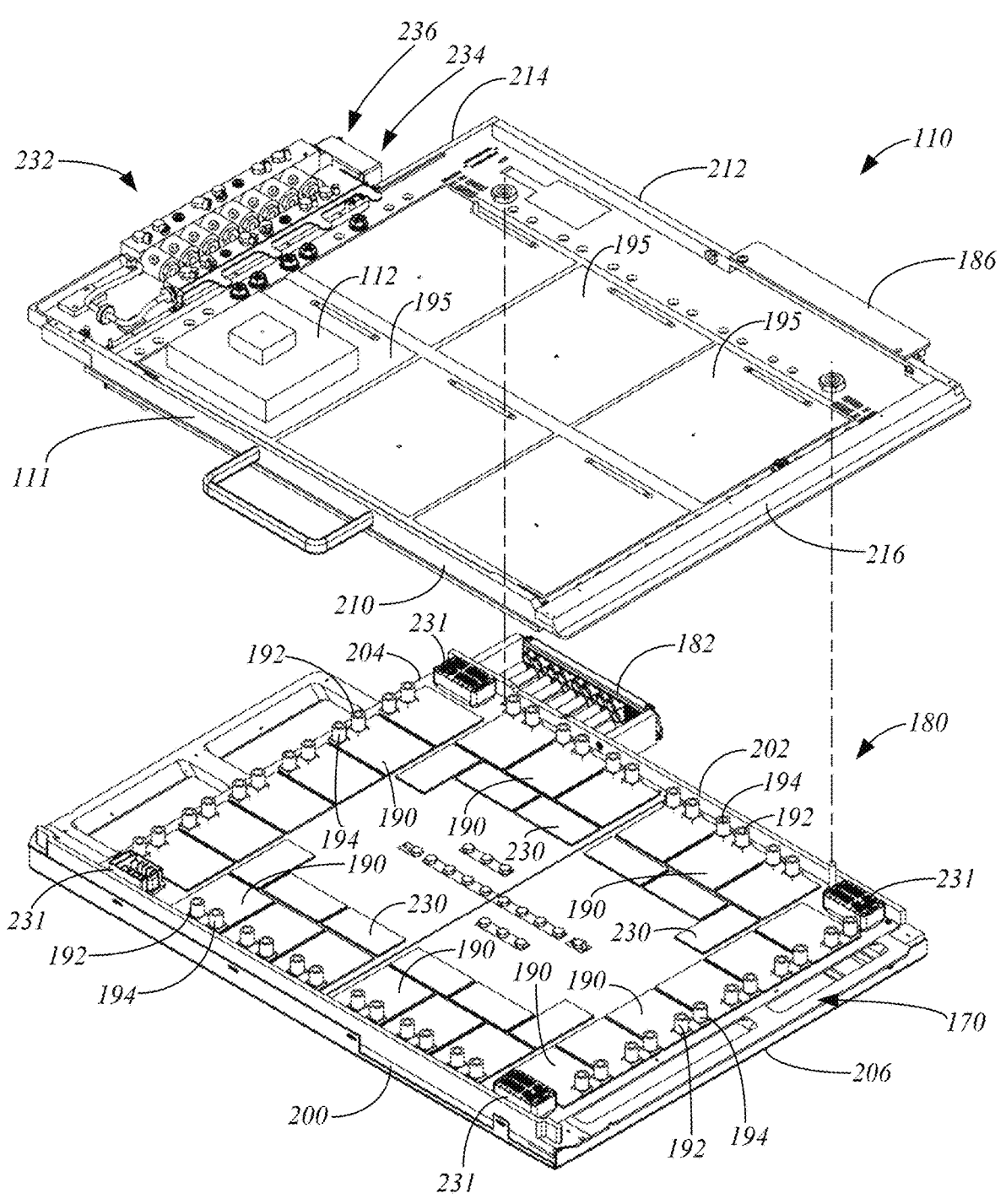
FIG. 7 is an isometric exploded view of an example of a semiconductor burn-in board in accordance with embodiments of the present disclosure.
Figure 8:
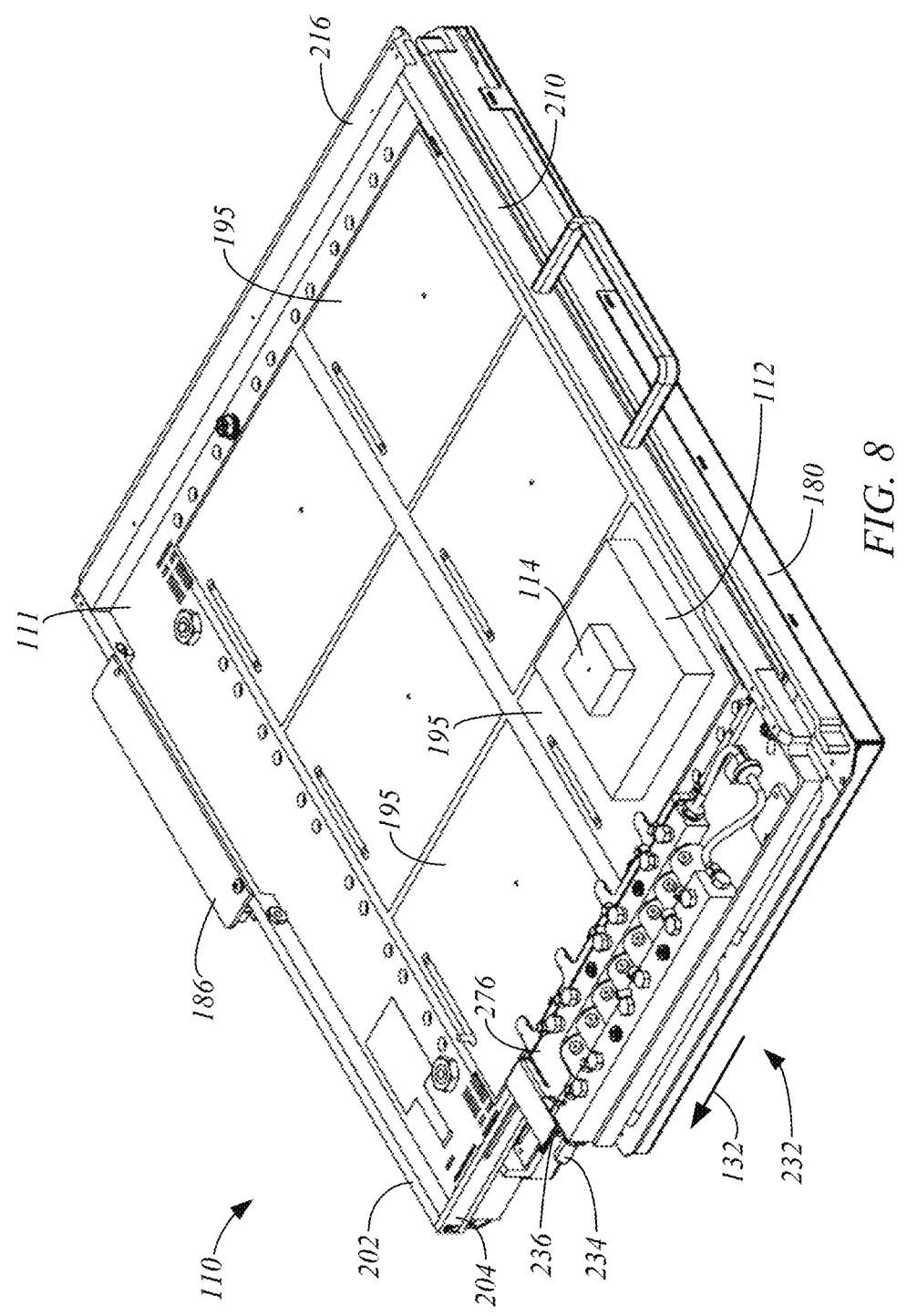
FIG. 8 is an isometric view of an example of an assembled semiconductor burn-in board in accordance with embodiments of the present disclosure.

FIG. 7 is an isometric exploded view of an example of the burn-in board 110 and FIG. 8 is an isometric view of an example of the assembled burn-in board 110 with the testing board 111 attached to a top side of the power regulator board 180, in accordance with embodiments of the present disclosure. FIGS. 7 and 8 each illustrate a schematic diagram of a device testing unit 112 on the testing board 111.

In some embodiments, the power regulator board 180 includes the main power connector 182 that is configured to receive the main power 168 from the pre-regulator of the machine electronics through pairs of positive and negative (electrical ground) connector pins. The power regulator board 180 also includes a plurality of power supplies 190 that receive the main power 168 from the connector 182 through suitable cabling or conductive pathways and convert the main power 168 into the test power 164. The test power 164 from each power supply 190 is fed to the device testing board 111 through a pair of test power connectors 192 and 194 (positive and negative or electrical ground). Control signals for controlling the power supplies 190 and their test power output may be provided through pins of the main power connector 182 or a separate connector.

The testing board 111 includes a plurality of conventional device testing units 112, such as six testing units 112, as shown in FIGS. 6A and 6B. The testing board 111 may include a pad 195 for each testing unit 112, as indicated in FIGS. 7 and 8. The testing board 111 also includes the testing stage connector 186 through which input/output signals (e.g., test signals) are communicated to the device testing units 112. The circuitry of the testing board 111 provides conductive pathways for routing the test power 164 from one or more of the power supplies 190 (FIG. 7) to each testing socket through the corresponding test power connectors 192 and 194. The device testing units 112 may be conventional units that are each configured to perform testing operations on a semiconductor device 104 received in a socket of the device testing unit 112 using the test power and the test signals.

Figure 9:
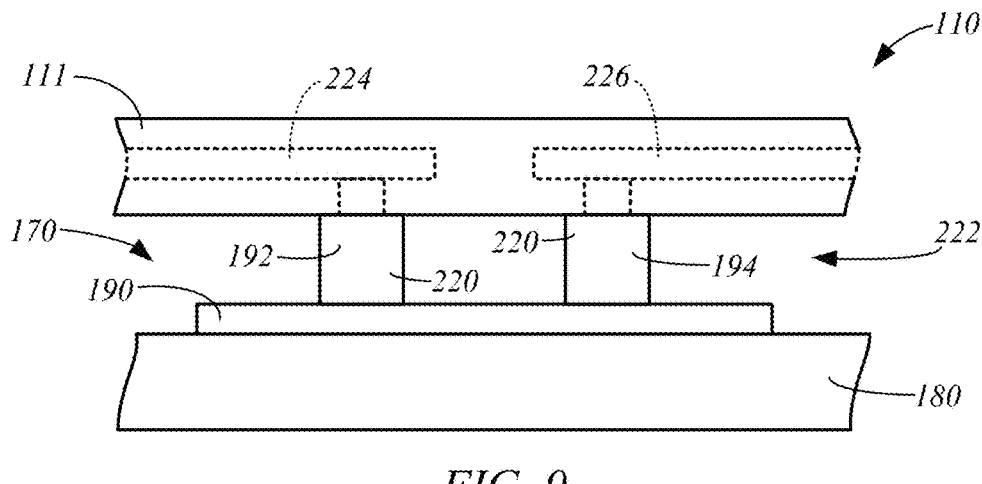
FIG. 9 is a simplified side view of a portion of an example of a semiconductor burn-in board in accordance with embodiments of the present disclosure.

In some embodiments, the power regulator board 180 and the testing board 111 are stacked over each other as shown in FIGS. 7, 8 and 9. FIG. 9 is a simplified side view of a portion of the assembled burn-in board 110, in accordance with embodiments of the present disclosure. The testing board 111 may be stacked above the power regulator board as illustrated in FIGS. 7-9.

The power regulator board 180 may include a front edge 200, a back edge 202 that is opposite the front edge 200, and opposing side edges 204 and 206 that extend from the front edge 200 to the back edge 202, as shown in FIG. 7. The main power connector 182 may be located along the back edge 202. The testing board 111 may include edges that correspond to the edges of the power regulator board, including a front edge 210, a back edge 212 that is opposite the front edge 210, and opposing side edges 214 and 216 that extend from the front edge 210 to the back edge 212, as shown in FIG. 7. The testing stage connector 186 is located along the back edge 212.

While the example testing board of FIG. 7 includes twenty-four power supplies 190 configured to deliver the test power 164 to the testing board 111, it is understood that embodiments of the power regulator board 180 include more or fewer power supplies 190. In one example, the power supplies 190 are organized in rows around the perimeter of the power regulator board, such as along the front edge 200, the back edge 202, the side edge 204, and/or the side edge 206, as shown in FIG. 7. Advantages to this configuration include maximizing the real estate that is available for the electronics of the testing stage (e.g., testing board 111) of the burn-in board 110.

In some embodiments, the test power connectors 192 and 194 of each power supply 190 may be arranged along the edges of the power regulator board 180, as shown in FIG. 7, and may each comprise a conductive stud 220 that extends vertically from the power regulator board 180 to the testing board 111, such as across a gap 222, as shown in FIG. 9. Each of the studs 220 connects to one of the conductive pathways of the testing board 111. The positive test power connectors 192 of multiple power supplies 190 may be connected in parallel through a conductive pathway 224 of the testing board 111 to increase the power that is supplied to a device testing unit. The corresponding negative or electrical ground test power connectors 194 of the multiple power supplies 190 may similarly be connected to each other in parallel through a conductive pathway 226.

The power regulator board 180 may also include one or more low power supplies 230 (FIG. 7) that may each be configured to provide supplemental power (e.g., 60 W) to circuitry of the testing board 111, such as circuitry for the I/O supply voltage of the semiconductor devices 104 under test. The low power supplies 230 may be located adjacent to the high power supplies 190. In some embodiments, the connectors 231 of the low power supplies 230 are located at the corners of the power regulator board 180.

The cooling system 150 (FIG. 4) may include a board cooling system 232 that generally comprises a liquid input 234, a liquid output 236 and a fluid circuit 238 that delivers a flow of liquid received at the input 234 from a liquid source 240 through the thermal heads 114 and to the liquid output 236 where the liquid flow may be discharged to an output 242, as indicated in FIGS. 6A, 6B, 7 and 8. The liquid circulated through the thermal heads 114 assists in maintaining the semiconductor devices 104 within a desired temperature range during stress test operations.

Figure 10:
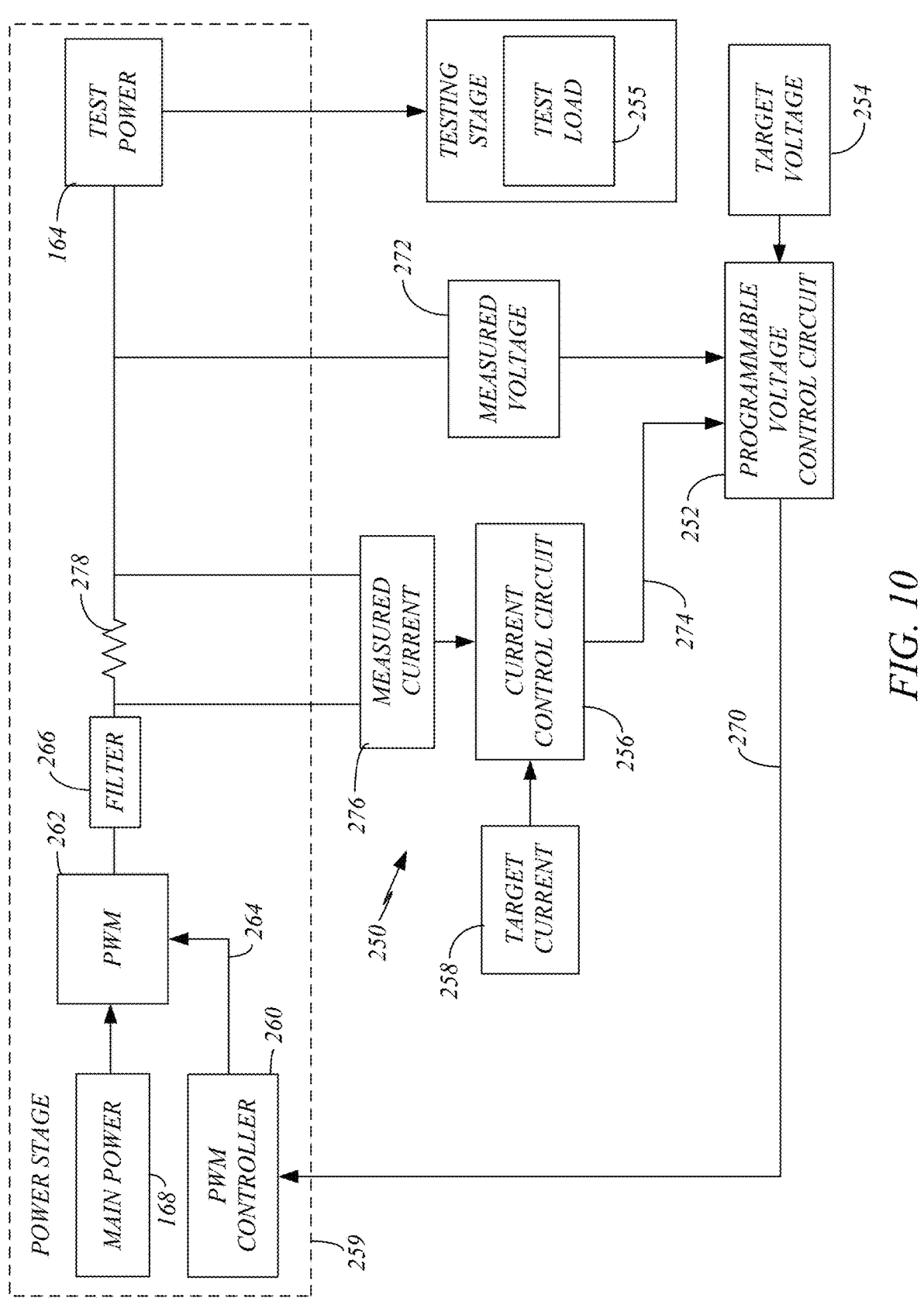
FIG. 10 is a simplified circuit diagram illustrating an example of a power supply in accordance with embodiments of the present disclosure.

FIG. 10 is a simplified circuit diagram illustrating an example of a power supply 190 of the post regulator 170 in accordance with embodiments of the present disclosure. The power supply 190 includes a power control circuit 250 that includes a programmable voltage control circuit 252, which operates to control the test power 164 to provide a desired target voltage 254 across the test load 255, which may comprise the semiconductor device 104 under test, and a current control circuit 256, which operates to prevent the test power 164 from exceeding a target current 258 (e.g., a current limit). During operation, the power supply 190 may switch between operating in a voltage control mode, in which the test power 164 is dictated by the voltage control circuit 252, to a current control mode, in which the test power 164 is generally dictated by the current control circuit 256.

In one embodiment, a power stage 259 of each power supply 190 includes a pulse width modulator (PWM) controller 260 and a pulse width modulator 262. The pulse width modulator 262 modulates the main power 168 received from the pre-regulator 166 based on a control signal 264 generated by the pulse width modulator controller 260 to produce a modulated power output that forms the test power 164. A filter 266 may be used to convert the modulated power output or test power 164 into the direct current form (e.g., 0.0-1.8 VDC) generally used by the testing stage of the burn-in board 110.

The programmable voltage control circuit 252 is configured to produce a voltage error signal 270 that is based on a difference between a measured voltage 272 across the test load 255 and the target voltage 254. The current control circuit 256 is configured to produce a current error signal 274 based on a difference between a measured current 276 through the test load 255, such as a voltage across a resistor 278, and the target current 258, which may take the form of a voltage, for example. The current error signal 274 affects the voltage error signal 270 when the measure current 276 exceeds the target current 258. The PWM controller 260 produces the control signal 264 based on the received error signal 270.

Thus, the power control circuit 250 is configured to output a measured voltage error signal 270 based on a difference between a measured parameter (e.g., measured voltage 272 or measured current 276) and a parameter setpoint (e.g., target voltage 254 or target current 258), and the pulse width modulator controller 260 produces the control signal 264 based on the error signal 270. The pulse width modulator 262 produces the test power 164 based on the control signal 264 and the main power 168.

Figure 11:
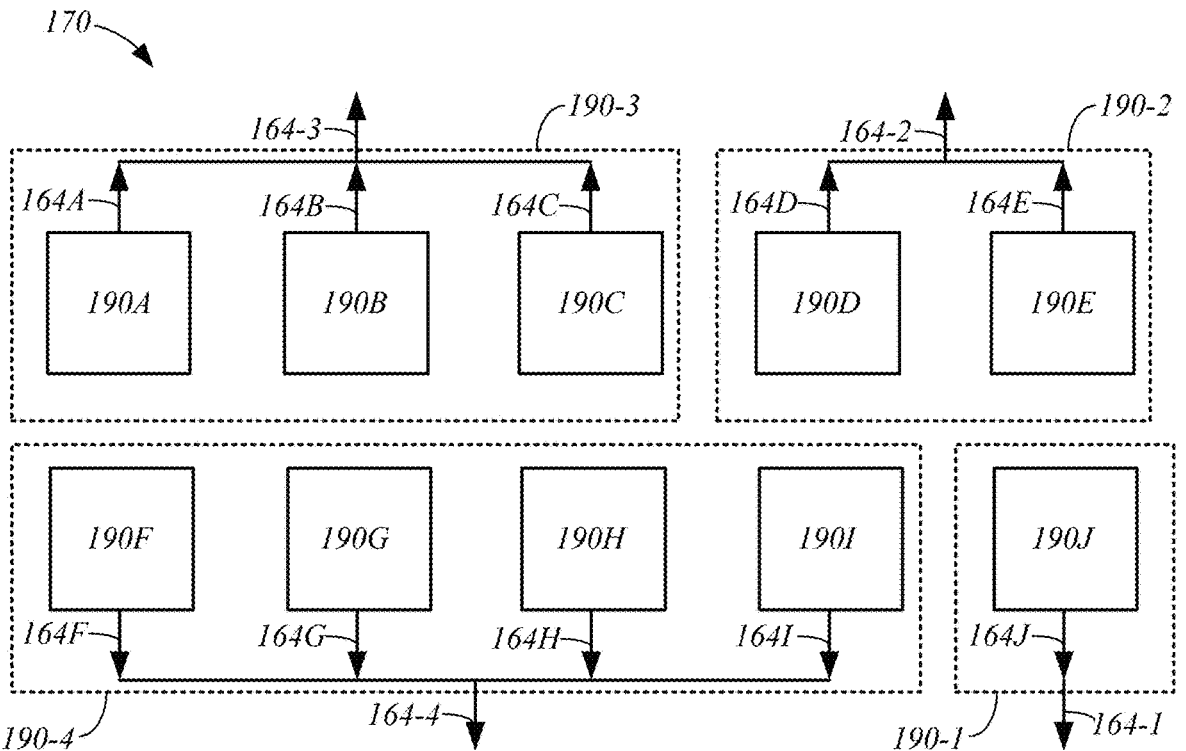
FIG. 11 is a simplified diagram of a group of the power supplies of a post regulator configured in various power modes in accordance with embodiments of the present disclosure.

The programmable nature of the power control circuits 250 of the power supplies 190 allows the post regulator 170 to be configurable in desired power modes, which utilize a different number of the power supplies 190 to generate the test powers 164 demanded by the testing stage of the testing board 111. FIG. 11 is a simplified diagram of a group of the power supplies 190A-J of the post regulator 170 configured in various power modes in accordance with embodiments of the present disclosure.

In the illustrated examples, a single power supply 190J or group 190-1 may be operated in a single power mode to produce test power 164-1, power supplies 190D and 190E may be operated as a group 190-2 in a dual power mode, in which their test powers 164D-E are combined in parallel to produce dual mode test power 164-2, power supplies 190A, 190B and 190C may be operated as a group 190-3 in a triple power mode, in which their test powers 164A-C are combined in parallel to produce triple mode test power 164-3, and power supplies 190F-I may be operated as a group 190-4 in a quad power mode, in which their test powers 164F-I are combined in parallel to produce quad mode test power 164-4. Accordingly, a series of power supplies 190 of the post regulator 170 may form various groups of power supplies 190 to provide one or more desired power modes to meet the test power demands of the testing stage.

Unlike conventional post regulators, embodiments of the post regulator 170 can allow for as many power modes as there are power supplies 190, while reducing the circuitry required to form the required distinct voltage control circuits for each power mode. Thus, when the post regulator has N (e.g., 16-30, such as 24) power supplies 190, the post regulator 170 may be configured to provide up to N unique power modes (e.g., 4 power modes) each combining the test powers of 1 to N of the power supplies 190 in parallel.

Figure 12:
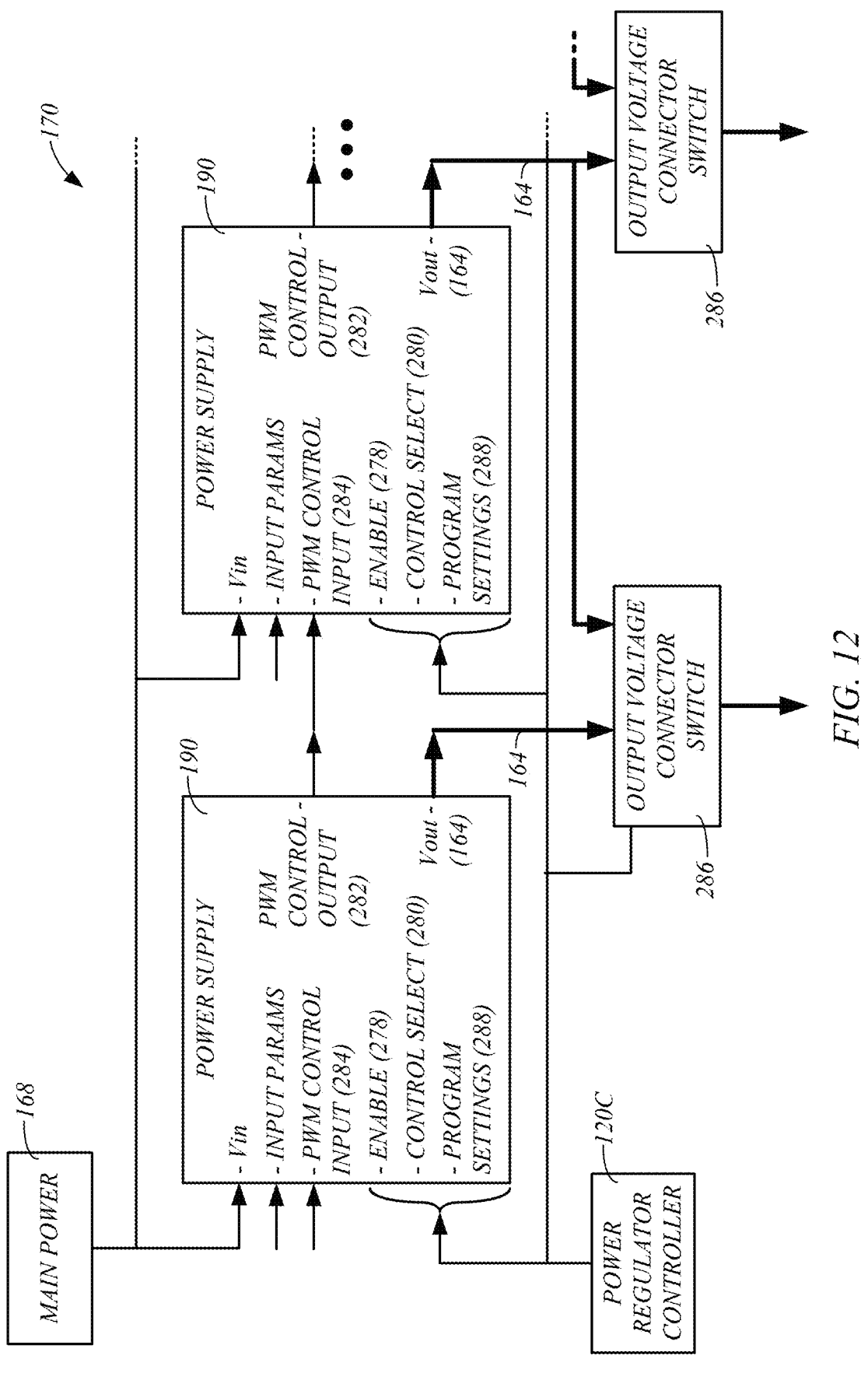
FIG. 12 is a simplified diagram of a portion of a power regulator in accordance with embodiments of the present disclosure.

FIG. 12 is a simplified diagram of a portion of a power regulator 170 comprising a series of power supplies 190 in accordance with embodiments of the present disclosure. While only two power supplies 190A and 190B are shown in the drawing, it is understood that the pattern of power supplies 190 may continue with up to N total power supplies, such as 16-30 power supplies, for example.

The power modes may be set by signals and settings that are communicated to the power supplies from one or more controllers, which are represented by a power regulator controller 120C. The signals and settings may be communicated to the power supplies 190 using any suitable technique, such as through a serial peripheral interface bus, and/or another suitable data communication technique. Some or all of the signals and settings may be communicated from a dedicated controller of the post regulator 170, and/or from a controller of the machine electronics, all of which are represented by the controller 120C.

Each power supply 190 is generally configured to receive the main power (Vin) 168 and input parameters. The input parameters may comprise the target voltage 254 and target current 258 (FIG. 10) for the power supply 190 that may be received from the controller 120C. Additionally, the input parameters may include the measured voltage 272 across the test load 255 and the measured current 276 to the test load 255 as discussed above with reference to FIG. 10. These input parameters are used by the power control circuit 250 of each power supply 190 to determine an error signal 270, which may be used by the PWM controller 260 to control the PWM 262 and the output test power 164.

Each power supply 190 may also include an enable input 278 that is used to either enable (e.g., logic 1) the power supply 190 for use in generating test power 164, or disable (e.g., logic 0) the power supply 190 so that it is effectively turned off. The enable input signal 278 may be provided by the controller 120C.

The controller 120C may also provide control select signals 280 to each of the power supplies 190 that are generally used to group the power supplies 190 based on the power modes that are to be implemented by the post regulator, as discussed above with regard to FIG. 11. The control select signal 280 to a power supply 190 generally designates whether the power supply 190 will operate as a primary power supply (logic 1) or a secondary power supply (logic 0).

When the power supply 190 operates as the primary power supply, its power control circuit 250 is used to determine the measured error signal 270 that is supplied to its PWM controller 260 (FIG. 10). Additionally, the primary power supply 190 outputs this voltage error signal 270 as a PWM control output 282, which is fed to the next power supply 190 in the series as its PWM control input 284. The first power supply 190 in the series may always be designated as a primary power supply, thus it's PWM control input 284 is not used. When the power supply 190 operates as the secondary power supply, its power control circuit 250 is bypassed, and the voltage error signal 270 received at its PWM control input 284 is used to control its PWM controller 260.

As a result, various groups of the power supplies 190 in the series may be formed to provide different power modes where the primary power supply of each group controls the measured error signal 270 that is used as the PWM control input 284 to each of the secondary power supplies in the group. For example, referring back to FIG. 11, the power supply 190A of the group 190-3 may be designated as the primary power supply and the power supplies 190B and 190C may be designated as secondary power supplies using the control select signals 280. As a result, the power supply 190A utilizes the measured error signal 270 generated by its power control circuit 250 to control its PWM controller 260 and PWM 262 to produce the test power 164A. The primary power supply 190A may output the measured error signal 270 at its PWM control output 282 to the PWM control input of the secondary power supply 190B. The secondary power supply 190B ignores the measured error signal 270 generated by its power control circuit 250 and uses the measured error signal 270 received at its PWM control input 284 to control its PWM controller 260 and PWM 262 to produce the test power 164B. The secondary power supply 190B outputs the received measured error signal 270 received from the primary power supply 190A at its PWM control output 282 which is coupled to the PWM control input 284 of the secondary power supply 190C. The secondary power supply 190C ignores the measured error signal 270 generated by its power control circuit 250 and uses the measured error signal 270 received at its PWM control input 282 to control its PWM controller 260 and PWM 262 to produce the test power 164C. Accordingly, the triple mode test power 164-3 is generated using the measured error signal 270 of the primary power supply 190A. The other power supply groups 190-1, 190-2 and 190-4 may be operated in a similar manner.

The test power 164 output from each of a group of power supplies 190 may be coupled to the test powers 164 output by the adjacent power supplies using a power coupler switch 286, which is controlled using a control signal (e.g., logic 0 or 1) from the controller 120C. A post regulator 170 having N power supplies may include N−1 switches 286. Each switch 286 may be formed using any suitable conventional switching circuit, such as a field effect transistor switch, for example.

Thus, for the group 190-4, three of the switches 286 are used to combine the test powers 164F-I, one connecting the output test powers 164F and 164G, one connecting the test powers 164G and 164H, and one connecting the test powers of the power supplies 164H and 164I. As a result, switches

286 operate to connect the test powers 164F-I in parallel to form the power 164-4, which may be provided to the testing stage of the burn-in board 110.

Any of the switches 286 that is between a pair of the power supplies 190 that are in different groups, such as power supply 1901 and power supply 190J is opened to disconnect the output test powers 164I and 164J from each other. In this manner, the output power from each group of power supplies 190 is isolated from the output power from an adjoining group.

Figure 13:
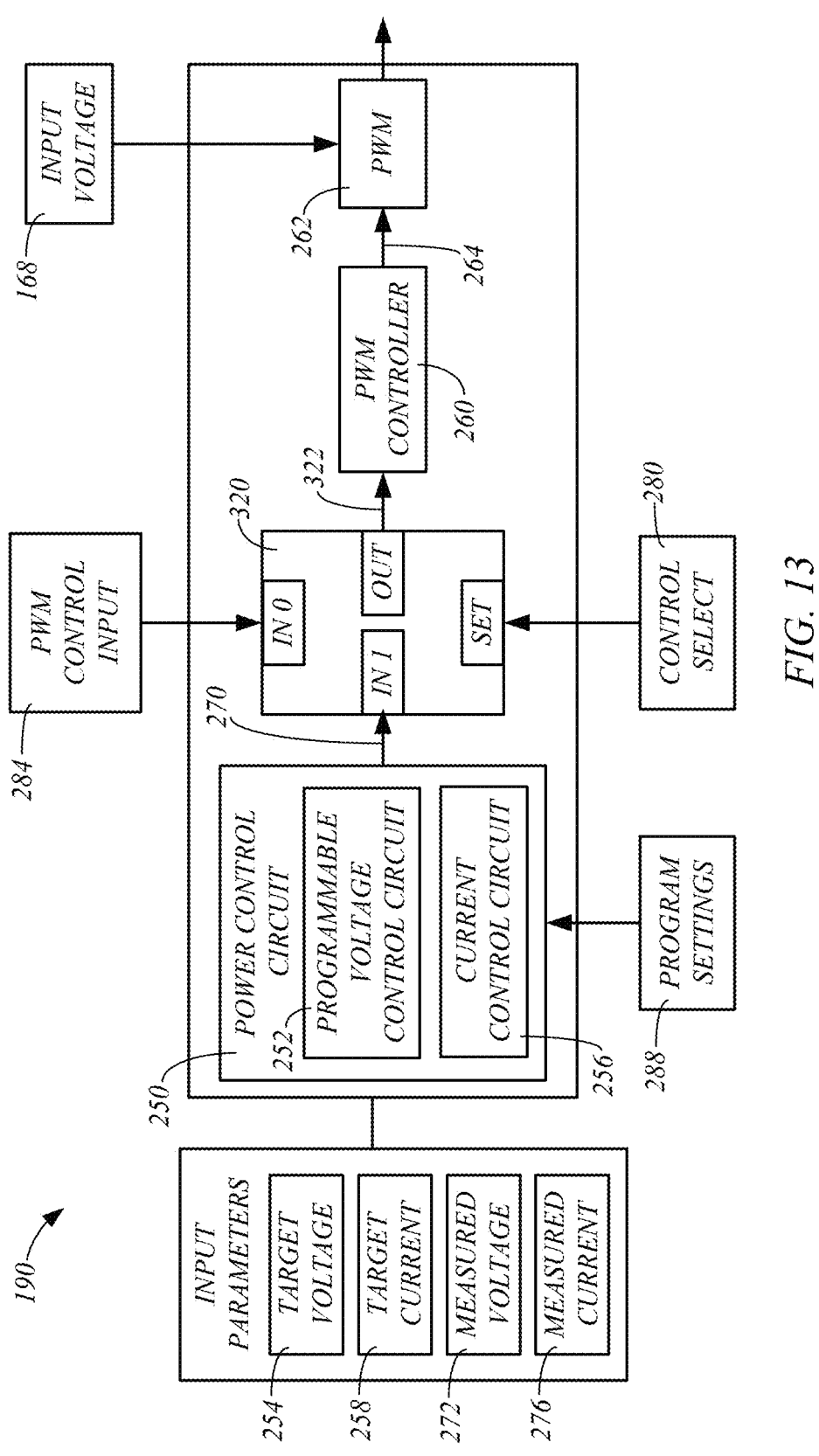
FIG. 13 is a simplified diagram of a power supply in accordance with embodiments of the present disclosure.

FIG. 13 is a simplified diagram of a power supply 190 in accordance with embodiments of the present disclosure. As mentioned above, the power control circuit 250 includes a programmable voltage control circuit 252 and a current control circuit 256. The circuits 252, 256 generally operate as discussed above based on input parameters, such as the target voltage 254 and the target current 258, which may be received from the controller 120C, and the measured voltage 272 and the measured current 276 associated with the power applied to the test load 255. The programmable voltage control circuit 252 is adjustable to provide the required voltage compensation for each power mode based on program settings 288 issued by the controller 120C.

Figure 14:
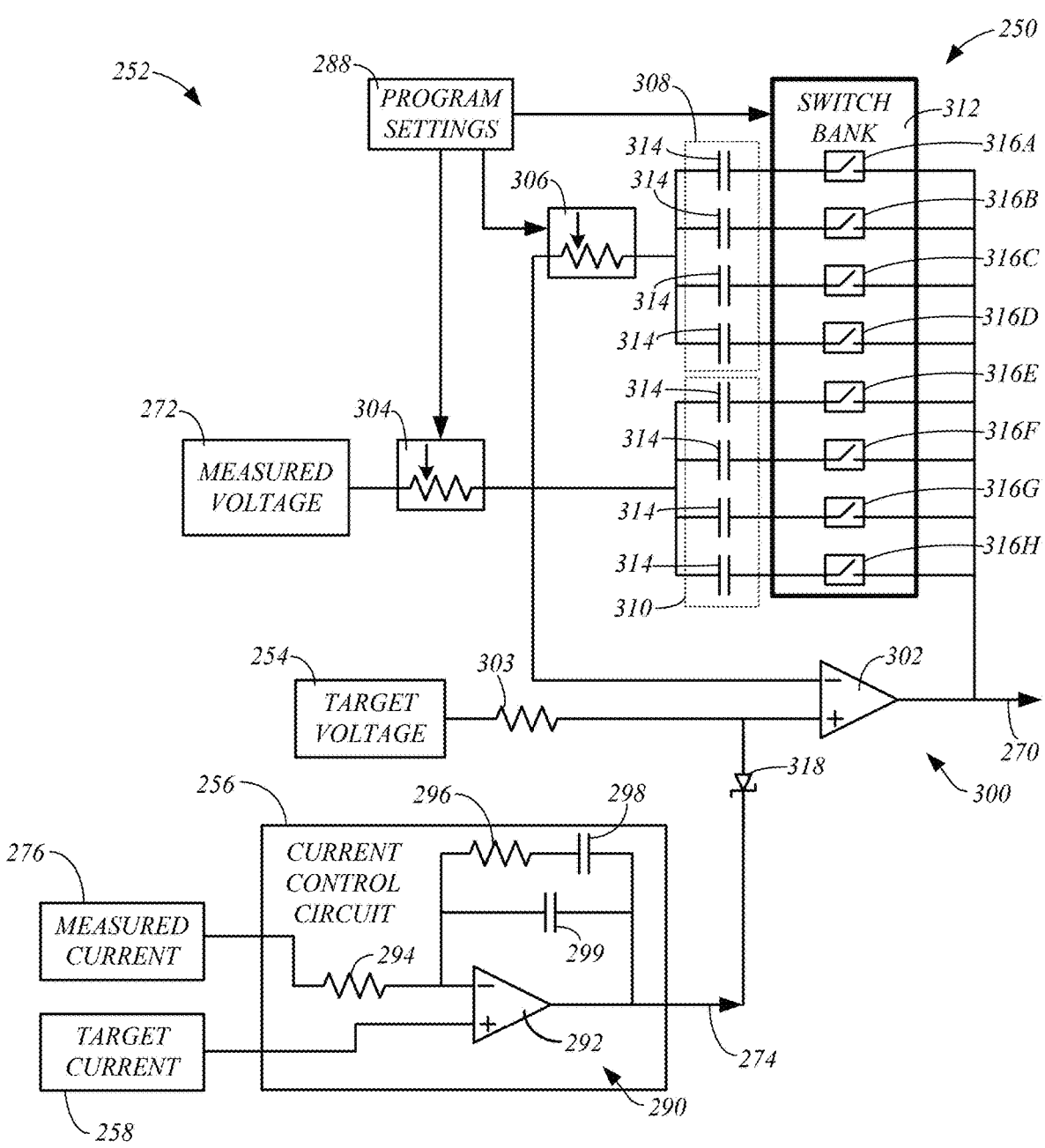
FIG. 14 is a simplified diagram of the power control circuit in accordance with embodiments of the present disclosure.

FIG. 14 is a simplified diagram of the power control circuit 250 in accordance with embodiments of the present disclosure. One example of the current control circuit 256 comprises a current error amplifier 290 that connects the measured current (e.g., a voltage) 276 to the inverting input of an operational amplifier 292 through a resistor 294. The target current (e.g., a voltage) 258, which may be provided by the controller 120C, is coupled to the non-inverting input of the operational amplifier 292. The current error amplifier 290 may take the form of a type II error amplifier and include alternating current (AC) coupled feedback between the output and the inverting input of the operational amplifier 292 that includes a resistor 296 and capacitors 298 and 299. The particular values of the circuit components of the error amplifier 290 may be selected based on the desired operation of the current control circuit 256. In one alternative configuration, the connections of the target current 258 and the measured current 276 to the operational amplifier 292 are flipped, and the output from the operational amplifier 292 may be provided to a summing amplifier.

The current error amplifier 290 outputs the current error signal (a voltage) 274, which will increase or decrease non-linearly with the difference between the voltages at the inverting and non-inverting inputs of the operational amplifier 292, which corresponds to the difference between the measured current 276 and the target current 258. Thus, the current error output signal 274 is indicative of the difference between the measured current 276 and the target current 258.

If the measured current 276 is greater than the target current 258, the voltage of the current error signal 274 will decrease until the measured current 276 and the target current 258 substantially equalize, then maintain that level provided that the target current 258 has not been exceeded. Accordingly, while the measured current 276 is less than the target current 258, the voltage of the current error signal 274 will remain at a "high" voltage level.

On the other hand, if the measured current 276 is greater than the target current 258, then the voltage of the current error signal 274 will decrease until the measured current 276 and the target current 258 substantially equalize, then maintain that level. Thus, while the measured current 276 exceeds the target current 258, the voltage of the current error signal 274 will remain at a "low" voltage level.

One example of the programmable voltage control circuit 252 includes a voltage error amplifier 300 that connects the measured voltage 272 to the inverting input of an operational amplifier 302 and connects the target voltage 254 to the non-inverting input of the operational amplifier 302 through a resistor 303. The voltage error amplifier 300 includes a programmable compensator circuit that provides AC coupled feedback between the output and the inverting input of the operational amplifier 302 and includes adjustable circuit component values that are set using the programmable settings 288 based on the power mode. As a result, the programmable voltage control circuit 252 circuit may be "tuned" in accordance with the current power mode to produce the required voltage error signal 270 based on the target voltage 254 and the measured voltage 272. Accordingly, the voltage control circuit 252 avoids the use of multiple distinct voltage control circuits for each power mode, resulting in a reduction in the circuitry required by each power supply 190, reduced cost, flexibility in forming power modes, and other advantages.

In one example the voltage error amplifier 300 may take the form of a type II error amplifier and include a digital potentiometer 304 through which the measured voltage 272 is coupled to the inverting input of the operational amplifier 302. The voltage error amplifier 300 may also include a digital potentiometer 306, a capacitor bank 308, a capacitor bank 310 and a switch bank 312. Each capacitor bank 308, 310 includes a plurality of capacitors 314, each having a different capacitance. One end of each of the capacitors 314 is coupled to the inverting input of the operational amplifier 302. While the example capacitor banks 308, 310 are each illustrated as including four capacitors 314, which may correspond to four distinct power modes for the power supply 190 (e.g., single, dual, triple and quad power modes), it is understood that the capacitor banks 308, 310 may include more or fewer capacitors 314 depending on the number of power modes to be implemented by the power supply 190. Furthermore, different capacitances may be selected by activating one or more of the capacitors 314 of the switch bank 312.

The switch bank 312 includes a plurality of switches 316A-D, each of which is connected to one of the capacitors 314 of the capacitor bank 308 and a plurality of switches 316E-H, each of which is connected to one of the capacitors 314 of the capacitor bank 310. Additionally, each of the switches 316 is connected to the output of the operational amplifier 302. One example of a suitable product that may be used as the switch bank 312 is the ADG714 switch bank produced by Analog Devices.

The program settings 288 received from the controller 120C based on the power mode include resistance settings that set the resistance of the digital potentiometers 304 and 306. Additionally, the program settings 288 control the switch bank 312 to close one or more of the switches 316A-D and one or more of the switches 316E-H, while the other switches remain open, to connect one or more of the capacitors 314 of the bank 308 in parallel to one or more of the capacitors 314 of the bank 310. Thus, the program settings 288 also operate to select capacitance values of the voltage error amplifier 300. In this manner, the programmable voltage control circuit 252 is tuned based on the power mode being implemented by the power supply.

In operation, the voltage error amplifier 300 outputs the measured error signal 270 that will increase or decrease non-linearly with the difference between the voltages at the inverting and non-inverting inputs of the operational amplifier 302. In general, if the voltage at the inverting input of the operational amplifier 302 is less than the voltage at the non-inverting input of the operational amplifier 302, the measured error signal 270 will increase until the voltages at the inverting and non-inverting inputs are balanced, then maintain that level. When the voltage at the inverting input of the amplifier 302 is greater than the voltage at the non-inverting input of the amplifier 302, the measured error signal 270 will be decreased until the voltages at the inverting and non-inverting inputs are balanced, then maintain that level.

In some embodiments, the current error signal 274 is coupled to the voltage error amplifier 300 to affect the measured error signal 270 when the power control circuit 250 is operating in the current control mode, and to not affect the measured error signal 270 when the power control circuit 250 is operating in the voltage control mode. This function may be facilitated in numerous ways.

In one example, the current error signal 274 is connected to the non-inverting input of the operational amplifier 302 through a diode (e.g., Schottkey diode) 318. The cathode of the diode 318 is coupled to the current error signal 274 and the anode of the diode 318 is coupled to the non-inverting input of the operational amplifier 302 of the voltage control circuit 252.

When the power control circuit 250 is in the voltage control mode of operation (i.e., measured current 276 is less than the target current 258), the current error signal 274 is at the "high" voltage level. The current control circuit 256 is designed such that this "high" voltage level causes the diode 318 to be reversed biased. As a result, the voltage at the non-inverting input of the operational amplifier 302 substantially corresponds to the target load voltage 254. Thus, when the power control circuit 250 is in the voltage control mode, the measured error signal 270 will be substantially based on the difference between the measured voltage 272 and the target voltage 254.

When the power control circuit 250 enters the current control mode of operation (i.e., the measured current 276 exceeds the target current 258), the current error signal 274 is at the "low" voltage level. The current control circuit 256 is designed such that this "low" voltage level causes the diode 318 to be forward biased. As a result, the voltage at the non-inverting input of the operational amplifier 302 of the voltage control circuit 252 is lowered or pulled below the level set by the target voltage 254. Therefore, the measured error signal 270 will be based on a difference between the measured voltage 272 and a voltage that is less than the target voltage 254 when the power control circuit 250 is in the current control mode. As a result, the measured error signal 270 will tend to cause the PWM controller 260 to reduce the voltage output by the PWM 262.

Referring again to FIG. 13, in one example, the measured error signal 270 output from the power control circuit 250 based on the input parameters and the program settings 288 may be provided to an input IN 1 of an error signal selector 320, which may take the form of a multiplexor. An input IN 0 of the error signal selector 320 may receive the PWM control output 282 through the PWM control input 284 (FIG. 12), which may be the measured error signal 270 from the adjoining power supply 190 (if present). The control select signal 280 from the controller 120C may be received at a set input SET of the error signal selector 320.

The control select signal 280 determines whether an error input 322 delivered to the PWM controller 260 by the error signal selector 320 will be the measured error signal 270 from the power control circuit 250 or the PWM control input 284. Thus, the control select signal 280 determines whether the power supply 190 will operate as a primary power supply or a secondary power supply.

When the control select input 280 designates input IN 1 of the error signal selector 320, the power supply 190 is set as a primary power supply and the measured error signal 270 is provided through an output OUT of the error signal selector 320 as the error input 322 to the PWM controller 260. When the control select signal 280 designates input IN 0 of the error signal selector 320, the power supply 190 is set as a secondary power supply and the PWM control input 284 received from an adjoining power supply is provided at the output OUT as the error input 322 to the PWM controller 260 by the error signal selector 320. The PWM controller 260 then controls the PWM 262 to modulate the input voltage (e.g., main power) 168 based on the received error input 322 to issue the test power 164, which may be coupled to the test power of other power supplies 190 within a group depending on the power mode, as discussed above.

Some embodiments are directed to methods of operating the power regulator for a testing stage of a semiconductor burn-in board. FIG. 15 is a flowchart illustrating an example of the method, in accordance with embodiments of the present disclosure.

As discussed above, the power regulator may comprise a plurality of the power supplies 190 and a power regulator controller 120C. In some embodiments, each power supply includes a PWM controller 260, a PWM 262, a power control circuit 250, and an error signal selector 320.

At 330 of the method, the control select signal 280 is sent to each of the power supplies 190 using the power regulator controller 120C. Each of the power supplies performs the following steps of the method. At 332, a PWM control signal 264 is produced based on a current error input 270 using the PWM controller 260, and a power output 164 (test power) is produced at 334 based on the PWM control signal using the PWM 262, as discussed above with reference to FIG. 10. At 336, a measured error signal 270 is output based on a difference between a measured parameter (e.g., measured voltage 272 or measured current 276) of the power output and a parameter setpoint (e.g., target voltage 254 or target current 258) using the power control circuit. At 338, the measured error signal 270 produced by the power supply 190 or the measured error signal 270 produced from another power supply 190 (e.g., power control output 282 received at the power control input 284) is output as the current error signal 270 to the PWM controller 260 of the power supply 190 using the error signal selector 320, as discussed above with regard to FIGS. 11-13. This allows the power supplies 190 to operate alone or in groups to provide the desired power for the testing stage of the burn-in board 110, as shown in FIG. 11.

Figure 16:
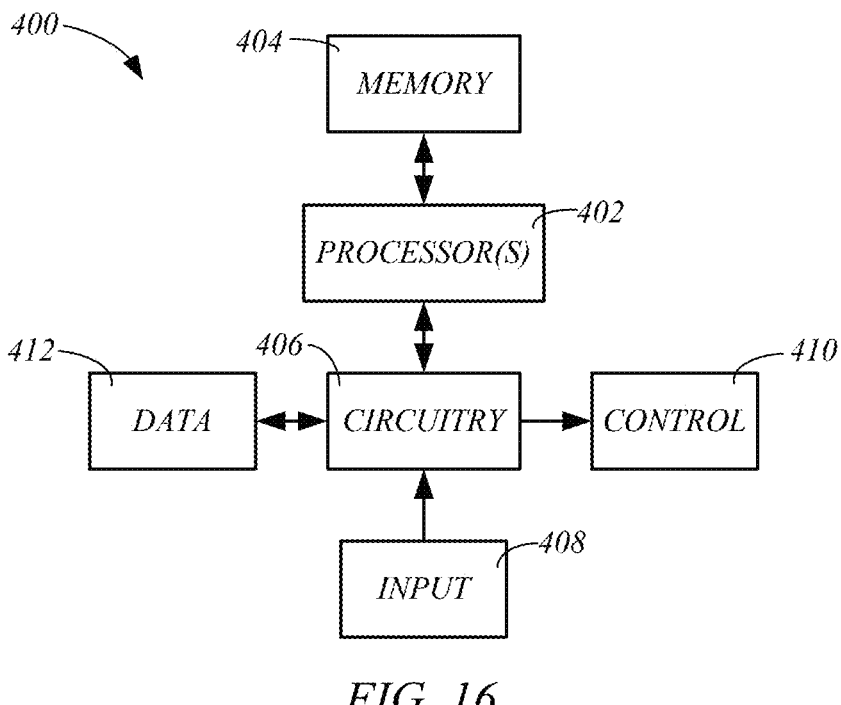
FIG. 16 is a simplified diagram of an example of a controller in accordance with embodiments of the present disclosure.

The one or more controllers 120 of the system, such as, for example, the temperature controller 120A, the test vector controller 120B, and the power regulator controller 120C, may take on any suitable form to control the various functions described herein. For example, the controllers 120 may take the form of controller 400 shown in the simplified diagram of FIG. 16. The controller 400 may include one or more processors 402 and memory 404. The one or more processors 402 are configured to perform various functions described herein in response to the execution of instructions contained in the memory 404.

The one or more processors 402 may be components of one or more computer-based systems, and may include one or more control circuits, microprocessor-based engine control systems, and/or one or more programmable hardware components, such as a field programmable gate array (FPGA). The memory 404 represents local and/or remote memory or computer readable media. Such memory 404 comprises any suitable patent subject matter eligible computer readable media and does not include transitory waves or signals. Examples of the memory 404 include conventional data storage devices, such as hard disks, CD-ROMs, optical storage devices, magnetic storage devices and/or other suitable data storage devices. The controller 400 may include circuitry 406 for use by the one or more processors 402 to receive input signals 408 (e.g., signals from I/O pins 174, temperature sensing circuit 156, etc.), issue control signals 410 (e.g., signals for controlling the heat exchange system 124, performing tests on semiconductor devices 104, controlling the power supplies 190, etc.) and/or communicate data 412, such as in response to the execution of the instructions stored in the memory 404 by the one or more processors 402.

Although the embodiments of the present disclosure have been described with reference to preferred embodiments, workers skilled in the art will recognize that changes may be made in form and detail without departing from the spirit and scope of the present disclosure.

What is claimed is:

1. A power regulator for a testing stage of a semiconductor burn-in board comprising:
a plurality of power supplies, each power supply comprising:
a pulse width modulator controller configured to produce a pulse width modulator control signal based on a current error input;
a pulse width modulator configured to produce a power output based on the pulse width modulator control signal;
a power control circuit configured to output a measured error signal based on a difference between a measured parameter of the power output and a parameter setpoint; and
an error signal selector configured to output as the current error input either the measured error signal or the measured error signal received from one of the other power supplies based on a control select signal; and
a power regulator controller configured to issue the control select signals to the power supplies based on a power mode.

2. The power regulator according to claim 1, wherein the power regulator is configured to selectively couple the power outputs from two or more of the power supplies in parallel based on the power mode.

3. The power regulator according to claim 2, wherein each power control circuit includes a programmable voltage control circuit configured to affect the measured error signal based on a measured voltage and a target voltage.

4. The power regulator according to claim 3, wherein:
each programmable voltage control circuit includes an adjustable resistance having a plurality of resistance values that affect the measured error signal; and
the controller is configured to set the resistance of each programmable voltage control circuit to one of the plurality of resistance values based on the power mode.

5. The power regulator circuit according to claim 4, wherein:
each programmable voltage control circuit includes at least one digital potentiometer having the plurality of resistance values; and the controller is configured to set the at least one digital potentiometer to one of the plurality of resistance values based on the power mode.

6. The power regulator according to claim 3, wherein:
each programmable voltage control circuit includes an adjustable capacitance having a plurality of capacitance values that affect the measured error signal; and
the controller is configured to set the capacitance of each programmable voltage control circuit to one of the plurality of capacitance values based on the power mode.

7. The power regulator according to claim 6, wherein:
each programmable voltage control circuit includes:
a plurality of first capacitors each having a different capacitance;
a plurality of second capacitors each having a different capacitance; and
a coupling circuit configured to selectively connect any one of the first capacitors in parallel with any one of the second capacitors to provide the plurality of capacitance values; and
the controller is configured to set the capacitance of each programmable voltage control circuit to one of the plurality of capacitance values through control of the coupling circuit based on the power mode.

8. The power regulator according to claim 3, wherein:
each programmable voltage control circuit includes an adjustable resistance having a plurality of resistance values and an adjustable capacitance having a plurality of capacitance values that affect the measured error signal; and
the controller is configured to set the resistance of each programmable voltage control circuit to one of the plurality of resistance values and set the capacitance of each programmable voltage control circuit to one of the plurality of capacitance values based on the power mode.

9. The power regulator according to claim 8, wherein the programmable voltage control circuit is in the form of a type II error amplifier.

10. The power regulator according to claim 9, wherein the power supplies are supported on a power regulator board that is attached to a burn-in board.

11. A method of operating a power regulator for a testing stage of a semiconductor burn-in board, the power regulator comprising:
a plurality of power supplies, each power supply comprising:
a pulse width modulator controller;
a pulse width modulator;
a power control circuit; and
an error signal selector; and
a power regulator controller,
the method comprising:
sending a control select signal to each of the plurality of power supplies based on a power mode using the power regulator controller; and
at each power supply:
producing a pulse width modulator control signal based on an error input using the pulse width modulator controller;
producing a power output based on the pulse width modulator control signal using the pulse width modulator;

outputting a measured error signal based on a difference between a measured parameter of the power output and a parameter setpoint using the power control circuit; and outputting as the error input to the pulse width modulator controller either the measured error signal or the measured error signal received from one of the other power supplies based on the control select signal using the error signal selector.

12. The method according to claim 11, including connecting two or more of the power outputs from the plurality of power supplies in parallel based on the power mode.

13. The method according to claim 12, wherein:

each power control circuit includes a programmable voltage control circuit; and the method includes affecting the measured error signal output by the power control circuit based on a measured voltage and a target voltage using the programmable voltage control circuit.

14. The method according to claim 13, wherein:

each programmable voltage control circuit includes an adjustable resistance having a plurality of resistance values that affect the measured error signal; and the method includes setting the resistance of each programmable voltage control circuit to one of the plurality of resistance values based on the power mode using the power regulator controller.

15. The method according to claim 13, wherein:

each programmable voltage control circuit includes an adjustable capacitance having a plurality of capacitance values that affect the measured error signal; and the method includes setting the capacitance of each programmable voltage control circuit to one of the plurality of capacitance values based on the power mode using the power regulator controller.

16. The method according to claim 15, wherein:

each programmable voltage control circuit includes:

a plurality of first capacitors each having a different capacitance;

a plurality of second capacitors each having a different capacitance; and a coupling circuit configured to selectively connect any one of the first capacitors in parallel with any one of the second capacitors to provide the plurality of capacitance values; and setting the capacitance of each programmable voltage control circuit to one of the plurality of capacitance values comprises controlling the coupling circuit of each programmable voltage control circuit based on the power mode.

17. The method according to claim 13, wherein:

each programmable voltage control circuit includes an adjustable resistance having a plurality of resistance values and an adjustable capacitance having a plurality of capacitance values that affect the measured error signal; and the method includes setting the resistance of each programmable voltage control circuit to one of the plurality of resistance values and setting the capacitance of each programmable voltage control circuit to one of the plurality of capacitance values based on the power mode.

18. The method according to claim 15, wherein the programmable voltage control circuit is in the form of a type II error amplifier.

19. The method according to claim 18, wherein the power supplies are supported on a power regulator board that is attached to a burn-in board.

* * * * *